(12) United States Patent
Chindalore et al.

(10) Patent No.: US 7,226,840 B2
(45) Date of Patent: Jun. 5, 2007

(54) PROCESS FOR FORMING AN ELECTRONIC DEVICE INCLUDING DISCONTINUOUS STORAGE ELEMENTS

(75) Inventors: Gowrishankar L. Chindalore, Austin, TX (US); Cheong M. Hong, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/188,909

(22) Filed: Jul. 25, 2005

(65) Prior Publication Data

US 2007/0020820 A1    Jan. 25, 2007

(51) Int. Cl.
*H01L 21/336*    (2006.01)
*H01L 29/76*    (2006.01)

(52) U.S. Cl. .................. 438/270; 438/212; 438/243; 257/330; 257/332; 977/707; 977/712

(58) Field of Classification Search ............... 438/270, 438/212, 243; 257/330, 332; 977/707, 712
See application file for complete search history.

(56) References Cited

U.S. PATENT DOCUMENTS

| | | | |
|---|---|---|---|
| 4,860,070 A | 8/1989 | Arimoto et al. |
| 5,705,415 A | 1/1998 | Orlowski et al. |
| 5,721,448 A | 2/1998 | Hauf et al. |
| 5,824,580 A | 10/1998 | Hauf et al. |
| 5,914,523 A | 6/1999 | Bashir et al. |
| 5,969,383 A | 10/1999 | Chang et al. |
| 6,074,954 A | 6/2000 | Lill et al. |
| 6,121,148 A | 9/2000 | Bashir et al. |
| 6,307,782 B1 | 10/2001 | Sadd et al. |
| 6,320,784 B1 | 11/2001 | Muralidhar et al. |
| 6,330,184 B1 | 12/2001 | White et al. |
| 6,399,441 B1 | 6/2002 | Ogura et al. |
| 6,583,466 B2 | 6/2003 | Lin et al. |
| 6,674,120 B2 | 1/2004 | Fujiwara |
| 6,706,599 B1 | 3/2004 | Sadd et al. |
| 6,818,512 B1 | 11/2004 | Hsieh |
| 6,894,339 B2 | 5/2005 | Fan et al. |

(Continued)

OTHER PUBLICATIONS

Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

(Continued)

*Primary Examiner*—Long Tran

(57) ABSTRACT

A process for forming an electronic device can include forming a first set of discontinuous storage elements over a primary surface of a substrate and forming a trench within the substrate. The process can also include forming a second set of discontinuous storage elements within the trench. The process can further include forming a first gate electrode within the trench, wherein a discontinuous storage element lies between the first gate electrode and a wall of the trench. The process can still further include removing a part of the second set of discontinuous storage elements and forming a second gate electrode over the first gate electrode. After forming the second gate electrode, substantially none of the second set of discontinuous storage elements lies along the wall of the trench at an elevation between an upper surface of the first gate electrode and the primary surface of the substrate.

20 Claims, 20 Drawing Sheets

U.S. PATENT DOCUMENTS

| | | | |
|---|---|---|---|
| 6,916,715 | B2 | 7/2005 | Hsiao et al. |
| 6,936,887 | B2 | 8/2005 | Harari et al. |
| 7,015,537 | B2 | 3/2006 | Lee et al. |
| 7,098,502 | B2* | 8/2006 | Mathew et al. ............. 257/308 |
| 2002/0151136 | A1 | 10/2002 | Lin et al. |
| 2003/0062565 | A1 | 4/2003 | Yamazaki et al. |
| 2003/0068864 | A1 | 4/2003 | Il-Yong et al. |
| 2004/0000688 | A1 | 1/2004 | Harari et al. |
| 2004/0121540 | A1 | 6/2004 | Lin |
| 2004/0248371 | A1 | 12/2004 | Wang |
| 2005/0037576 | A1 | 2/2005 | Chen et al. |
| 2005/0148173 | A1* | 7/2005 | Shone ........................ 438/672 |
| 2005/0259475 | A1 | 11/2005 | Forbes |
| 2005/0280089 | A1 | 12/2005 | Forbes |
| 2005/0280094 | A1 | 12/2005 | Forbes |
| 2006/0152978 | A1 | 7/2006 | Forbes |
| 2006/0166443 | A1 | 7/2006 | Forbes |

OTHER PUBLICATIONS

Hayashi, Y., et al. "Twin MONOS Cell with Dual Control Gates," 2000 Symposium on VLSI Technology Digest of Technical Papers, pp. 122-123, 2000.

Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.

May, Y. et al. "A Dual-Bit Split-Gate EEPROM (DSG) Cell in Contactless Array for Single-Vcc High Density Flash Memories," IEDM, p. 57-60, 1994.

Osabe, T. et al. "Charge-Injection Length in Silicon Nanocrystal Memory Cells," 2004 Symposium on VLSI Technology Digest of Technical Papers p. 242-243, 2004.

Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.

U.S. Appl. No. 10/961,295, filed Oct. 8, 2004.
U.S. Appl. No. 11/079,674, filed Mar. 14, 2005.
U.S. Appl. No. 11/188,935, filed Jul. 25, 2005.
U.S. Appl. No. 11/188,999, filed Jul. 25, 2005.
U.S. Appl. No. 11/188,953, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,584, filed Jul. 25, 2005.
U.S. Appl. No. 11/188,591, filed Jul. 25, 2005.
U.S. Appl. No. 11/188,939, filed Jul. 25, 2005.
U.S. Appl. No. 11/188,588, filed Jul. 25, 2005.
U.S. Appl. No. 11/188,603, filed Jul. 25, 2005.
U.S. Appl. No. 11/188,615, filed Jul. 25, 2005.
U.S. Appl. No. 11/188,582, filed Jul. 25, 2005.
U.S. Appl. No. 11/188,583, filed Jul. 25, 2005.
U.S. Appl. No. 11/188,604, filed Jul. 25, 2005.
U.S. Appl. No. 11/188,585, filed Jul. 25, 2005.
U.S. Appl. No. 11/525,747, filed Sep. 22, 2006.
U.S. Appl. No. 11/626,762, filed Jan. 24, 2007.
U.S. Appl. No. 11/626,753, filed Jan. 24, 2007.
U.S. Appl. No. 11/626,768, filed Jan. 24, 2007.

* cited by examiner

| | GL1 2842 | GL2 2844 | GL3 2846 | GL4 2848 | GL5 2849 | BL1 2862 | BL2 2864 | BL3 2866 |
|---|---|---|---|---|---|---|---|---|
| PGM 28111 | 6 | 8 | 8 | 0 | 0 | 5 | 0 | F |
| READ 28111 | 3.5 | 6 | 6 | 0 | 0 | 0 | 2 | F |
| PGM 28112 | 8 | 6 | 6 | 0 | 0 | 5 | 0 | F |
| READ 28112 | 3.5 | 6 | 6 | 0 | 0 | 2 | 0 | F |
| PGM 28113 | 6 | 8 | 6 | 0 | 0 | 0 | 5 | F |
| READ 28113 | 6 | 3.5 | 6 | 0 | 0 | 0 | 2 | F |
| PGM 28114 | 6 | 8 | 6 | 0 | 0 | 5 | 0 | F |
| READ 28114 | 6 | 3.5 | 6 | 0 | 0 | 2 | 0 | F |
| PGM 28115 | 6 | 6 | 8 | 0 | 0 | 0 | 5 | F |
| READ 28115 | 6 | 6 | 3.5 | 0 | 0 | 0 | 2 | F |
| PGM 28116 | 8 | 8 | 6 | 0 | 0 | 0 | 5 | F |
| READ 28116 | 6 | 6 | 3.5 | 0 | 0 | 2 | 0 | F |
| PGM 28121 | 0 | 8 | 6 | 8 | 0 | F | 5 | 0 |
| READ 28121 | 0 | 6 | 3.5 | 6 | 0 | F | 0 | 2 |
| PGM 28122 | 0 | 6 | 8 | 6 | 0 | F | 5 | 0 |
| READ 28122 | 0 | 6 | 3.5 | 6 | 0 | F | 2 | 0 |
| PGM 28123 | 0 | 8 | 6 | 6 | 0 | F | 0 | 5 |
| READ 28123 | 0 | 3.5 | 6 | 6 | 0 | F | 0 | 2 |
| PGM 28124 | 0 | 8 | 6 | 6 | 0 | F | 5 | 0 |
| READ 28124 | 0 | 3.5 | 6 | 6 | 0 | F | 2 | 0 |
| PGM 28125 | 0 | 6 | 6 | 8 | 0 | F | 0 | 5 |
| READ 28125 | 0 | 6 | 6 | 3.5 | 0 | F | 0 | 2 |
| PGM 28126 | 0 | 8 | 8 | 6 | 0 | F | 0 | 5 |
| READ 28126 | 0 | 6 | 6 | 3.5 | 0 | F | 2 | 0 |

|  | GL1 3142 | GL2 3144 | GL3 3146 | GL4 3148 | GL5 3150 | GL6 3152 | BL1 3162 | BL2 3164 | BL3 3166 | BL4 3168 |
|---|---|---|---|---|---|---|---|---|---|---|
| PGM 31111 | 6 | 8 | 0 | 0 | 0 | 0 | 5 | F | 0 | F |
| READ 31111 | 3.5 | 6 | 0 | 0 | 0 | 0 | 0 | F | 2 | F |
| PGM 31112 | 8 | 6 | 0 | 0 | 0 | 0 | 5 | F | 0 | F |
| READ 31112 | 3.5 | 6 | 0 | 0 | 0 | 0 | 2 | F | 0 | F |
| PGM 31113 | 6 | 8 | 0 | 0 | 0 | 0 | 0 | F | 5 | F |
| READ 31113 | 6 | 3.5 | 0 | 0 | 0 | 0 | 0 | F | 2 | F |
| PGM 31114 | 8 | 6 | 0 | 0 | 0 | 0 | 0 | F | 5 | F |
| READ 31114 | 6 | 3.5 | 0 | 0 | 0 | 0 | 2 | F | 0 | F |
| PGM 31121 | 0 | 6 | 8 | 0 | 0 | 0 | 0 | F | 5 | F |
| READ 31121 | 0 | 3.5 | 6 | 0 | 0 | 0 | 2 | F | 0 | F |
| PGM 31122 | 0 | 8 | 6 | 0 | 0 | 0 | 0 | F | 5 | F |
| READ 31122 | 0 | 3.5 | 6 | 0 | 0 | 0 | 0 | F | 2 | F |
| PGM 31123 | 0 | 6 | 8 | 0 | 0 | 0 | 5 | F | 0 | F |
| READ 31123 | 0 | 6 | 3.5 | 0 | 0 | 0 | 2 | F | 0 | F |
| PGM 31124 | 0 | 8 | 6 | 0 | 0 | 0 | 5 | F | 0 | F |
| READ 31124 | 0 | 6 | 3.5 | 0 | 0 | 0 | 0 | F | 2 | F |
| PGM 31131 | 0 | 0 | 0 | 6 | 8 | 0 | 5 | F | F | 0 |
| READ 31131 | 0 | 0 | 0 | 3.5 | 6 | 0 | 0 | F | F | 2 |
| PGM 31132 | 0 | 0 | 0 | 8 | 6 | 0 | 5 | F | F | 0 |
| READ 31132 | 0 | 0 | 0 | 3.5 | 6 | 0 | 2 | F | F | 0 |
| PGM 31133 | 0 | 0 | 0 | 6 | 8 | 0 | 0 | F | F | 5 |
| READ 31133 | 0 | 0 | 0 | 6 | 3.5 | 0 | 0 | F | F | 2 |
| PGM 31134 | 0 | 0 | 0 | 8 | 6 | 0 | 0 | F | F | 5 |
| READ 31134 | 0 | 0 | 0 | 6 | 3.5 | 0 | 2 | F | F | 0 |
| PGM 31141 | 0 | 0 | 0 | 0 | 6 | 8 | 0 | F | F | 5 |
| READ 31141 | 0 | 0 | 0 | 0 | 3.5 | 6 | 2 | F | F | 0 |
| PGM 31142 | 0 | 0 | 0 | 0 | 8 | 6 | 0 | F | F | 5 |
| READ 31142 | 0 | 0 | 0 | 0 | 3.5 | 6 | 0 | F | F | 2 |
| PGM 31143 | 0 | 0 | 0 | 0 | 6 | 8 | 5 | F | F | 0 |
| READ 31143 | 0 | 0 | 0 | 0 | 6 | 3.5 | 2 | F | F | 0 |
| PGM 31144 | 0 | 0 | 0 | 0 | 8 | 6 | 5 | F | F | 0 |
| READ 31144 | 0 | 0 | 0 | 0 | 6 | 3.5 | 0 | F | F | 2 |

*FIG. 37*

|  | GL1 3442 | GL2 3444 | GL3 3446 | GL4 3448 | BL1 3462 | BL2 3464 | BL3 3466 | BL4 3468 | BL5 3469 |
|---|---|---|---|---|---|---|---|---|---|
| PGM 34111 | 6 | 8 | 0 | 0 | 5 | 0 | 0 | 0 | 0 |
| READ 34111 | 3.5 | 6 | 0 | 0 | 0 | 2 | 2 | 2 | 2 |
| PGM 34112 | 8 | 6 | 0 | 0 | 5 | 0 | 0 | 0 | 0 |
| READ 34112 | 3.5 | 6 | 0 | 0 | 2 | 0 | 0 | 0 | 0 |
| PGM 34113 | 6 | 8 | 0 | 0 | 0 | 5 | 5 | 5 | 5 |
| READ 34113 | 6 | 3.5 | 0 | 0 | 0 | 2 | 2 | 2 | 2 |
| PGM 34114 | 8 | 6 | 0 | 0 | 0 | 5 | 5 | 5 | 5 |
| READ 34114 | 6 | 3.5 | 0 | 0 | 2 | 0 | 0 | 0 | 0 |
| PGM 34121 | 8 | 6 | 0 | 0 | 5 | 5 | 0 | 0 | 0 |
| READ 34121 | 6 | 3.5 | 0 | 0 | 0 | 0 | 2 | 2 | 2 |
| PGM 34122 | 6 | 8 | 0 | 0 | 5 | 5 | 0 | 0 | 0 |
| READ 34122 | 3.5 | 6 | 0 | 0 | 2 | 2 | 0 | 0 | 0 |
| PGM 34123 | 8 | 6 | 0 | 0 | 0 | 0 | 5 | 5 | 5 |
| READ 34123 | 3.5 | 6 | 0 | 0 | 0 | 0 | 2 | 2 | 2 |
| PGM 34124 | 6 | 8 | 0 | 0 | 0 | 0 | 5 | 5 | 5 |
| READ 34124 | 3.5 | 6 | 0 | 0 | 2 | 2 | 0 | 0 | 0 |
| PGM 34131 | 6 | 0 | 8 | 0 | 5 | 5 | 5 | 0 | 0 |
| READ 34131 | 3.5 | 0 | 6 | 0 | 0 | 0 | 0 | 2 | 2 |
| PGM 34132 | 8 | 0 | 6 | 0 | 5 | 5 | 5 | 0 | 0 |
| READ 34132 | 3.5 | 0 | 6 | 0 | 2 | 2 | 2 | 0 | 0 |
| PGM 34133 | 6 | 0 | 8 | 0 | 0 | 0 | 0 | 5 | 5 |
| READ 34133 | 6 | 0 | 3.5 | 0 | 0 | 0 | 0 | 2 | 2 |
| PGM 34134 | 8 | 0 | 6 | 0 | 0 | 0 | 0 | 5 | 5 |
| READ 34134 | 6 | 0 | 3.5 | 0 | 2 | 2 | 2 | 0 | 0 |
| PGM 34141 | 8 | 0 | 6 | 0 | 5 | 5 | 5 | 5 | 0 |
| READ 34141 | 6 | 0 | 3.5 | 0 | 0 | 0 | 0 | 0 | 2 |
| PGM 34142 | 6 | 0 | 8 | 0 | 5 | 5 | 5 | 5 | 0 |
| READ 34142 | 3.5 | 0 | 6 | 0 | 2 | 2 | 2 | 2 | 0 |
| PGM 34143 | 8 | 0 | 6 | 0 | 0 | 0 | 0 | 0 | 5 |
| READ 34143 | 3.5 | 0 | 6 | 0 | 0 | 0 | 0 | 0 | 2 |
| PGM 34144 | 6 | 0 | 8 | 0 | 0 | 0 | 0 | 0 | 5 |
| READ 34144 | 3.5 | 0 | 6 | 0 | 2 | 2 | 2 | 2 | 2 |

*FIG. 40*

| | GL1 3742 | GL2 3744 | GL3 3746 | GL4 3748 | BL1 3762 | BL2 3764 | BL3 3766 | BL4 3768 | BL5 3770 | BL6 3772 |
|---|---|---|---|---|---|---|---|---|---|---|
| PGM 37111 | 6 | 8 | 0 | 0 | 5 | 0 | 0 | 0 | 0 | 0 |
| READ 37111 | 3.5 | 6 | 0 | 0 | 0 | 2 | 2 | 0 | 0 | 0 |
| PGM 37112 | 8 | 6 | 0 | 0 | 5 | 0 | 0 | 0 | 0 | 0 |
| READ 37112 | 3.5 | 6 | 0 | 0 | 2 | 0 | 0 | 0 | 0 | 0 |
| PGM 37113 | 6 | 8 | 0 | 0 | 0 | 5 | 5 | 0 | 0 | 0 |
| READ 37113 | 6 | 3.5 | 0 | 0 | 0 | 2 | 2 | 0 | 0 | 0 |
| PGM 37114 | 8 | 6 | 0 | 0 | 0 | 5 | 5 | 0 | 0 | 0 |
| READ 37114 | 6 | 3.5 | 0 | 0 | 2 | 0 | 0 | 0 | 0 | 0 |
| PGM 37121 | 8 | 6 | 0 | 0 | 5 | 5 | 0 | 0 | 0 | 0 |
| READ 37121 | 6 | 3.5 | 0 | 0 | 0 | 2 | 2 | 0 | 0 | 0 |
| PGM 37122 | 8 | 6 | 0 | 0 | 5 | 0 | 0 | 0 | 0 | 0 |
| READ 37122 | 6 | 3.5 | 0 | 0 | 2 | 0 | 0 | 0 | 0 | 0 |
| PGM 37123 | 8 | 6 | 0 | 0 | 0 | 0 | 5 | 0 | 0 | 0 |
| READ 37123 | 3.5 | 6 | 0 | 0 | 0 | 2 | 2 | 0 | 0 | 0 |
| PGM 37124 | 6 | 8 | 0 | 0 | 0 | 0 | 5 | 0 | 0 | 0 |
| READ 37124 | 3.5 | 6 | 0 | 0 | 2 | 0 | 0 | 0 | 0 | 0 |
| PGM 37131 | 6 | 0 | 8 | 0 | 0 | 0 | 0 | 5 | 0 | 0 |
| READ 37131 | 3.5 | 0 | 6 | 0 | 0 | 0 | 0 | 0 | 2 | 2 |
| PGM 37132 | 8 | 0 | 6 | 0 | 0 | 0 | 0 | 5 | 5 | 0 |
| READ 37132 | 3.5 | 0 | 6 | 0 | 0 | 0 | 0 | 2 | 0 | 0 |
| PGM 37133 | 6 | 0 | 8 | 0 | 0 | 0 | 0 | 0 | 5 | 5 |
| READ 37133 | 6 | 0 | 3.5 | 0 | 0 | 0 | 0 | 0 | 2 | 2 |
| PGM 37134 | 8 | 0 | 6 | 0 | 0 | 0 | 0 | 0 | 5 | 5 |
| READ 37134 | 6 | 0 | 3.5 | 0 | 0 | 0 | 0 | 2 | 0 | 0 |
| PGM 37141 | 6 | 0 | 6 | 0 | 0 | 0 | 0 | 5 | 5 | 0 |
| READ 37141 | 8 | 0 | 3.5 | 0 | 0 | 0 | 0 | 0 | 0 | 2 |
| PGM 37142 | 6 | 0 | 6 | 0 | 0 | 0 | 0 | 5 | 5 | 0 |
| READ 37142 | 8 | 0 | 3.5 | 0 | 0 | 0 | 0 | 2 | 2 | 0 |
| PGM 37143 | 8 | 0 | 6 | 0 | 0 | 0 | 0 | 0 | 0 | 5 |
| READ 37143 | 3.5 | 0 | 6 | 0 | 0 | 0 | 0 | 0 | 0 | 2 |
| PGM 37144 | 6 | 0 | 8 | 0 | 0 | 0 | 0 | 0 | 0 | 5 |
| READ 37144 | 3.5 | 0 | 6 | 0 | 0 | 0 | 0 | 2 | 2 | 0 |

*FIG. 43* ated to U.S. patent application Ser.
PROCESS FOR FORMING AN ELECTRONIC DEVICE INCLUDING DISCONTINUOUS STORAGE ELEMENTS

CROSS-REFERENCE TO RELATED APPLICATIONS

This application is related to U.S. patent application Ser. No. 11/188,910 entitled "Electronic Device Including Discontinuous Storage Elements" by Chindalore et al. filed on Jul. 25, 2005, which is assigned to the current assignee hereof and incorporated herein by reference in its entirety.

BACKGROUND

1. Field of the Disclosure

The present invention relates to processes for forming electronic devices, and more particularly, to processes for forming electronic devices that include discontinuous storage elements.

2. Description of the Related Art

Floating gate non-volatile memories ("FG NVM") are conventional and are commonly used in many applications. The three most common types of programming mechanisms for FG NVM include Fowler-Nordheim tunneling, conventional hot carrier injection, and source-side injection. Fowler-Nordheim tunneling is efficient but is very slow. Efficiency can be measured by dividing the number of carriers that enter a floating gate or one or more other storage elements divided by the number of carriers that enter a memory cell having the floating or the other storage element(s). The latter number can be approximated by using the product of the programming current and the programming time.

Hot carrier injection can include conventional hot carrier injection and source-side injection. Both involve the generation of hot carriers, some of which are injected into the floating or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

Source-side injection is a popular compromise, with respect to efficiency and programming current, between Fowler-Nordheim tunneling and conventional hot carrier injection. With source-side injection, hot carriers are still generated, however, most of the hot carriers are generated within a portion of the channel region that is spaced apart from the drain region. Memory cells designed to be programmed by source-side injection are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIGS. 32 through 43 includes circuit schematic diagrams, cross-sectional views of exemplary physical embodiments of the circuit schematic diagrams, and operating voltage tables for memory cell along a row within an NVM array.

Figure 1:
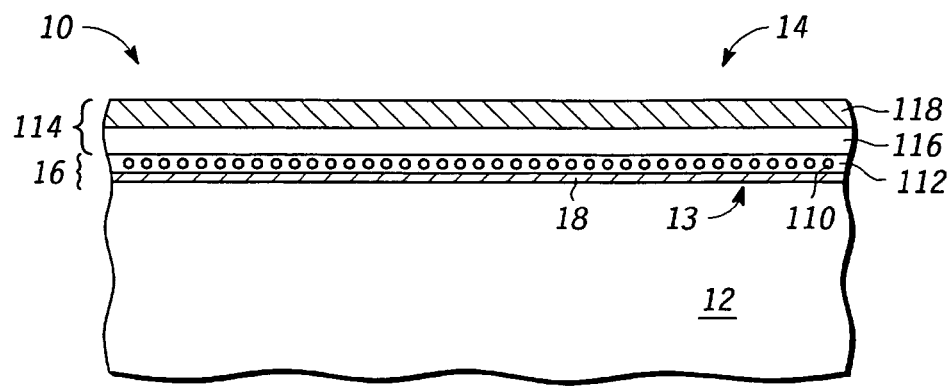
FIG. 1 includes an illustration of a cross-sectional view of a portion of a workpiece after formation of a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include discontinuous storage elements. In one embodiment, the electronic device can include a substrate that includes a first trench. The trench can include a wall and a bottom and extends from a primary surface of the substrate. The electronic device can also include discontinuous storage elements, wherein a first portion of the discontinuous storage elements lie at least within the first trench, and a second portion of the discontinuous storage elements lie along the primary surface of the substrate adjacent to the first trench. The second portion of the discontinuous storage elements can be spaced apart from the first portion of the discontinuous storage elements. The electronic device can further include a first gate electrode overlying at least the second set of the discontinuous storage elements, wherein an upper surface of the first gate electrode lies below the primary surface of the substrate. The electronic device can also include a second gate electrode overlies the first gate electrode. In one embodiment, the first set of the discontinuous storage elements that lie between the second gate electrode and the primary surface of the substrate. Embodiments described herein also include processes for forming the electronic device.

The electronic device can include a memory array in which bit lines, gate lines, or any combination thereof can take advantage of the trench design and buried bit lines. In one embodiment, at least one of the memory cells can include a gate electrode that includes a control gate portion and a select gate portion. In another embodiment, a select gate line may be electrically connected to a different number of rows or columns of memory cells as compared to a control gate line. In a particular embodiment, a select gate line may be electrically connected to one row or one column of memory cells, and the control gate line may be electrically connected to two rows or two columns of memory cells. In still another embodiment, a similar relationship may exist for bit lines. In yet another embodiment, a select gate line and a control gate line may be substantially perpendicular to each other. The select gate line may be electrically connected to a different number of rows or columns of memory cells as compared to the control gate line. In a particular embodiment, a select gate line may be electrically connected to one row or one column of memory cells, and the control gate line may be electrically connected to two columns or two rows of memory cells.

Before addressing details of embodiments described below, some terms are defined or clarified. The term "discontinuous storage elements" is intended to mean spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "primary surface" is intended to mean a surface of a substrate from which memory cells within a memory array are subsequently formed. The primary surface may be an original surface of a substrate before forming any electronic components or may be a surface from which trenches or other permanent structures within the memory array are formed. For example, the memory array may be formed at least partly within an epitaxial layer overlying a base material, and electronic components within peripheral area (outside the memory array) may be formed from the base material. In this example, the primary surface refers to the upper surface of the epitaxial layer, and not the original surface of the base material.

The term "stack" is intended to mean a plurality of layers or a plurality of at least one layer and at least one structure (e.g., nanocrystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes an illustration of a cross-sectional view of a portion of electronic device 10, such as an integrated circuit. The integrated circuit can be a standalone memory, a microcontroller, or other integrated circuit that includes a memory. In one embodiment, electronic device 10 can include non-volatile memory ("NVM") array 14, a portion of which is illustrated in FIG. 1. Substrate 12 can include a monocrystalline semiconductor wafer, a semiconductor-on-insulator wafer, a flat panel display (e.g., a silicon layer over a glass plate), or other substrate conventionally used to form electronic devices. The upper surface of substrate 12 is primary surface 13. Optionally, the doping concentration of substrate 12 along primary surface 13 within NVM array 14 can be increased using a conventional doping operation to potentially reduce leakage current between subsequently-formed gate electrodes that may overlie portions of primary surface 13. Although not illustrated, shallow trench field isolation may be formed over portions of substrate 12 in peripheral areas, which are outside the NVM array 14. Also not illustrated, an optional sacrificial layer may be formed and removed. A sacrificial layer can improve the properties of subsequently-formed dielectric layers.

Charge storage stack 16, including dielectric layer 18, discontinuous storage elements 110, and dielectric layer 112 can then formed, as illustrated in FIG. 1. In one embodiment, charge storage stack 16 is formed immediately adjacent to primary surface 13. Dielectric layer 18 may be thermally grown using an oxidizing or nitridizing ambient, or deposited using a conventional chemical vapor deposition technique, physical vapor deposition technique, atomic layer deposition technique, or a combination thereof. Dielectric layer 18 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. Dielectric layer 18 can have a thickness in a range of approximately 1 to approximately 10 nm. The thickness and material selection of dielectric layer 18 will substantially determine its electrical properties. In one embodiment the thickness and material are chosen such that dielectric layer 18 has a silicon dioxide equivalent thickness of less than 10 nm.

The set of discontinuous storage elements 110 are then formed over NVM array 14. Discontinuous storage elements 110 are substantially physically separated one from another. Discontinuous storage elements 110 can include a material capable of storing a charge, such as silicon, a nitride, a metal-containing material, another suitable material capable of storing charge, or any combination thereof. For example, discontinuous storage elements 110 can include silicon nanocrystals or metal nanoclusters. In one particular embodiment, a substantially continuous layer of amorphous silicon can be formed over exposed surfaces of substrate 12. The substantially continuous layer can be exposed to heat or other processing conditions that can cause the layer to "ball up" or otherwise form silicon nanocrystals. Discontinuous storage elements 110 may be undoped, doped during deposition, or doped after deposition. In one embodiment, discontinuous storage elements 110 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of discontinuous storage elements 110 is no greater than approximately 10 nm in any dimension. In another embodiment, discontinuous storage elements 110 can be larger, however, discontinuous storage elements 110 are not formed so large as to form a continuous structure (i.e., all discontinuous storage elements 84 are not fused together). Thus, during formation of the discontinuous storage elements 110, some individual portions may coalesce to form clusters, however, such clusters are discontinuous storage elements 110.

Dielectric layer 112 is then formed over discontinuous storage elements 110. Dielectric layer 112 can include one or more dielectric films. Dielectric layer 112 can include any one or more materials or be formed using any of the embodiments as described with respect to dielectric 18 layer. Dielectric layer 112 can have the same or different composition compared to dielectric 18 layer and may be formed using the same or different formation technique compared to dielectric layer 18.

A protective layer 114 can be formed which includes intervening layer 116 and oxidation-resistant layer 118. Intervening layer 116 can function as a pad layer during processing. In one embodiment, in a finished device, remaining portions of intervening layer 116 can be conductive or made to be conductive (e.g., by doping) and can set the work function for charge storage stack 16. In another embodiment, intervening layer 116 can be polysilicon, doped polysilicon, metal, or a metal-containing material. In yet another embodiment, intervening layer 116 can be less than approximately 200 nm in thickness. Oxidation-resistant layer 118 can be formed using one or more conventional techniques. Protective layer 114 can include intervening layer 116 and oxidation-resistant layer 118. In one embodiment, oxidation-resistant layer 118 includes a nitride.

Figure 2:
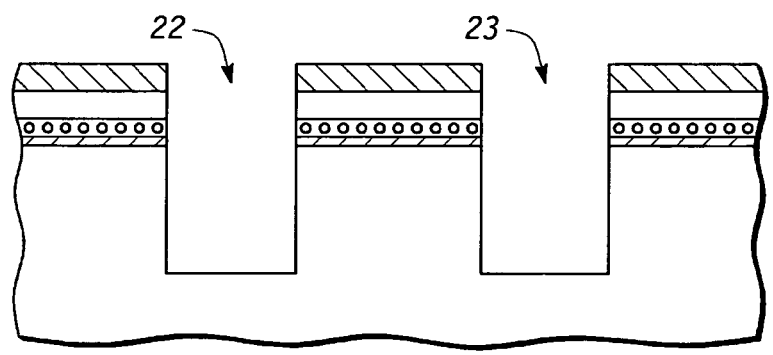
FIG. 2 includes an illustration of a cross-sectional view of the workpiece of FIG. 1 after formation of trenches.

A patterned resist layer (not illustrated), which includes openings at locations within NVM array 14 where trenches are to be formed, is formed over substrate 12 by a conventional technique. Exposed portions of overlying layers can then be removed by a conventional technique to expose primary surface 13. In one embodiment, trenches 22 and 23, as illustrated in FIG. 2, are formed prior to removal of the patterned resist layer. In another embodiment, the patterned resist layer is removed, and trenches 22 and 23 can then be formed by a conventional technique. Trenches 22 and 23 are spaced apart from each other, extend into substrate 12 from primary surface 13, and each includes a wall and a bottom. The depth of trenches 22 and 23 can, at least in part, determine the channel length of one or more of the memory cells being formed adjacent to trenches 22 and 23. In one embodiment, the depths of trenches 22 and 23 are in a range of approximately 50 to approximately 500 nm. In one particular embodiment, trenches 22 and 23 are formed using a timed anisotropic etch to produce substantially vertical walls. In one embodiment, trenches 22 and 23 have substantially uniform depths.

Figure 3:
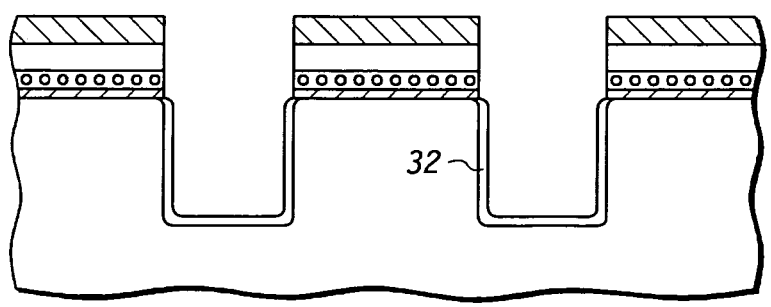
FIG. 3 includes an illustration of a cross-sectional view of a workpiece of FIG. 2 after formation of an insulating layer within the trenches.

Insulating layer 32 is formed along the exposed surfaces of trenches 22 and 23, as illustrated in FIG. 3. Insulating layer 32 may or may not be substantially conformal. In one embodiment, insulating layer 32 may include an oxide, a nitride, an oxynitride, or a combination thereof. In one embodiment, insulating layer 32 can be used as an implant screen. In one particular embodiment, insulating layer 32 is formed by thermally oxidizing the exposed portions of substrate 12 within trenches 22 and 23. Thermal oxidation can be beneficial in removing defects, such as those induced by etching, help to round corners of trenches 22 and 23, or a combination thereof. In another embodiment (not illustrated), insulating layer 32 can be deposited. A deposited insulating layer 32 would cover substantially all exposed surfaces of the workpiece.

Figure 4:
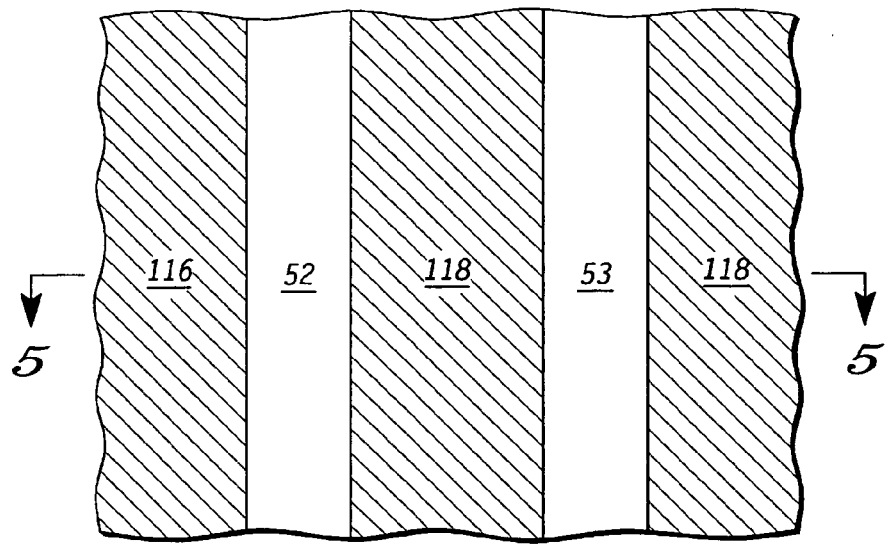
FIGS. 4 and 5 include illustrations of a top view and a cross-sectional view, respectively, of the workpiece of FIG. 3 after formation of doped regions at the bottom the trenches.
Figure 5:
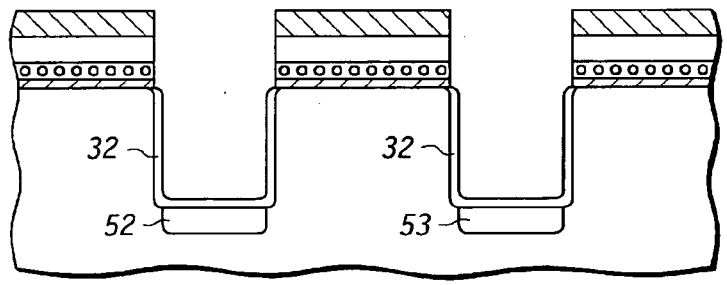

A dopant is introduced into portions of substrate 12 at the bottom of trenches 22 and 23 to form doped regions 52 and 53, as illustrated in top and cross-sectional views, in FIGS. 4 and 5, respectively. In FIG. 4 and other top views, some dielectric or insulating layers are not illustrated to simplify understanding of positional relationships between features within NVM array 14. Doped region 52 lies within substrate 12 and below trench 22, and doped region 53 lies within substrate 12 and below trench 23. In one embodiment, doped regions 52 and 53 can be source/drain ("S/D") regions and act as buried bit lines. The dopant may be a p-type dopant (e.g., boron) or an n-type dopant (e.g., phosphorus or arsenic). In one embodiment, the dopant can be introduced using ion implantation. An optional thermal cycle can be performed to activate the dopant. In another embodiment, subsequent processing may have one or more thermal cycles capable of activating the dopant. At the bottom of trenches 22 and 23, the doping concentration of doped regions 52 and 53 is at least approximately 1E19 atoms/cm$^3$.

Figure 6:
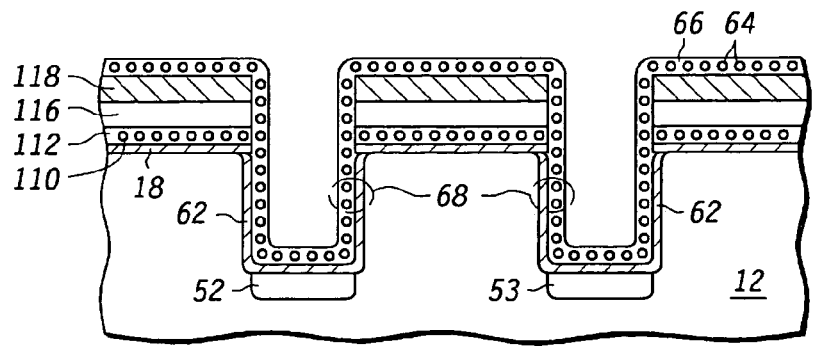
FIG. 6 includes an illustration of a cross-sectional view of the workpiece of FIG. 5 after formation of a charge storage stack including discontinuous storage elements.

Charge storage stack 68, including dielectric layer 62, discontinuous storage elements 64, and dielectric layer 66 can then formed, as illustrated in FIG. 6. In one embodiment, insulating layer 32 can be removed prior to formation of dielectric layer 62 over the exposed surface of trenches 22 and 23, including the walls and bottoms of trenches 22 and 23. In another embodiment, insulating layer 32 is used in place of or in conjunction with dielectric layer 62. Charge storage stack 68 can be formed following an embodiment previously described for charge storage stack 16. Portions of charge storage stack 68 may be formed of the same or different materials as charge storage stack 16 and be formed by the same or different techniques as charge storage stack 16. For example, the set of discontinuous storage elements 110 may have the same or different composition as compared to the set of discontinuous storage elements 64.

Figure 7:
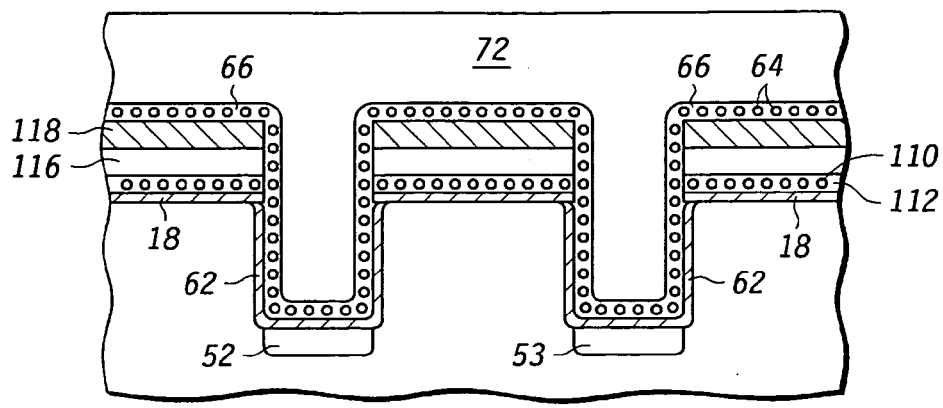
FIG. 7 includes an illustration of a cross-sectional view of the workpiece of FIG. 6 after formation of a conductive layer over the substrate.

Conductive layer 72 is then formed overlying the workpiece, as illustrated in FIG. 7. Conductive layer 72 can include one or more semiconductor-containing or metal-containing films. In one embodiment, conductive layer 72 includes polysilicon or amorphous silicon deposited by a chemical vapor deposition process. In another embodiment, conductive layer 72 may include one or more other materials or may be deposited by another process. In one particular embodiment, conductive layer 72 is doped when deposited, and in another particular embodiment, is doped after it is deposited. The thickness of conductive layer 72 is sufficient to at least substantially fill in the trenches within NVM array 14. In one embodiment, the thickness of conductive layer 72 is in a range of approximately 50 to approximately 500 nm, and in a finished device, remaining portions of conductive layer 72 have a dopant concentration of at least approximately 1E19 atoms/cm$^3$ when conductive layer 72 includes polysilicon or amorphous silicon.

Figure 8:
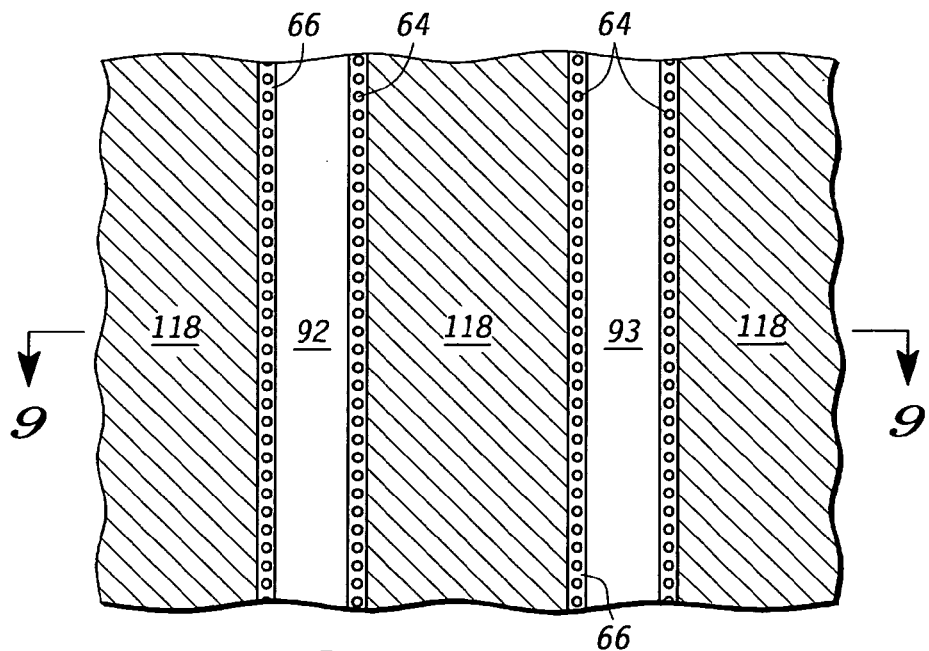
FIGS. 8 and 9 include illustrations of a top view and a cross-sectional view, respectively, of the workpiece in FIG. 7 after formation of gate electrodes.
Figure 9:
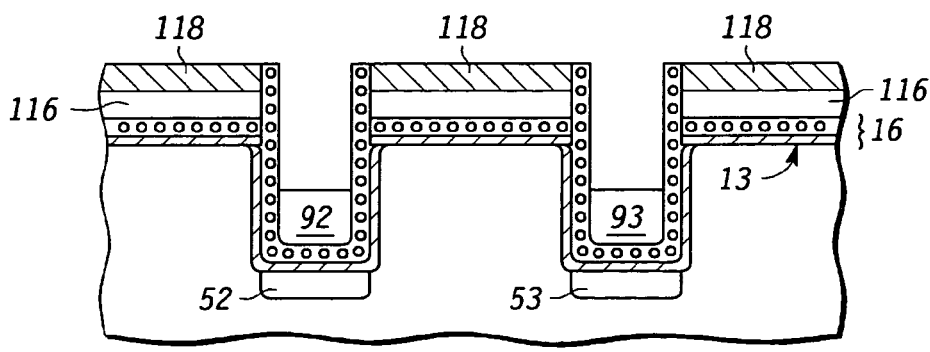

Portions of conducting layer 72 lying outside trenches 22 and 23 can be removed, as illustrated in FIGS. 8 and 9. Additional portions of conductive layer 72 are removed such that the remaining portions of conductive layer 72 are recessed below primary surface 13 and contained within trenches 22 and 23 to form gate electrodes 92 and 93, each of which has an upper surface that lies below primary surface 13. Gate electrode 92 overlies one portion of discontinuous storage elements 64 within trench 22, and gate electrode 93 overlies another portion of discontinuous storage elements 64 within trench 23. Each of gate electrodes 92 and 93 lies adjacent to a wall portion of discontinuous storage elements 64 within trenches 22 and 23 respectively. In one embodiment, each of gate electrodes 92 and 93 has a substantially rectangular shape, as seen from a cross-sectional view. In one particular embodiment, conductive layer 72 is undoped polysilicon, as initially deposited. Gate electrodes 92 and 93 are then doped by conventional techniques such that in a finished device, gate electrodes 92 and 93 have a concentration of at least approximately 1E19 atoms/cm$^3$. In another embodiment, a material capable of reacting with silicon to form a silicide, and can include Ti, Ta, Co, W, Mo, Zr, Pt, other suitable material, or any combination thereof is formed on gate electrodes 92 and 93 and reacted to form a metal silicide.

In one particular embodiment, removal of a portion of conductive layer 72 is accomplished by polishing with a conventional technique to expose oxidation-resistant layer 118, followed by a timed etch. In another embodiment (not illustrated), the removal is accomplished by an etch process without polishing. In another embodiment, portions of charge storage stack 68 may remain overlying protective layer 116. In another embodiment the recess, which is the elevational difference between the primary surface 13 and the upper surfaces of the gate electrodes 92 and 93, is between 20% and 80% of the depth of trenches 22 and 23.

Figure 10:
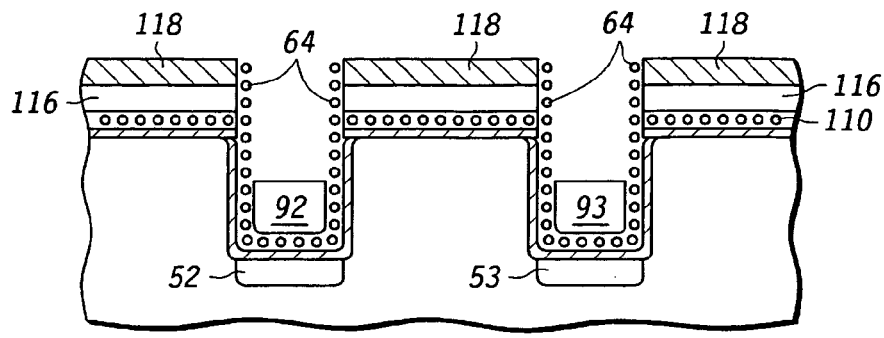
FIG. 10 includes an illustration of a cross-sectional view of the workpiece of FIGS. 8 and 9 after removal of the dielectric layer from exposed portions of the charge storage stack within the array.
Figure 11:
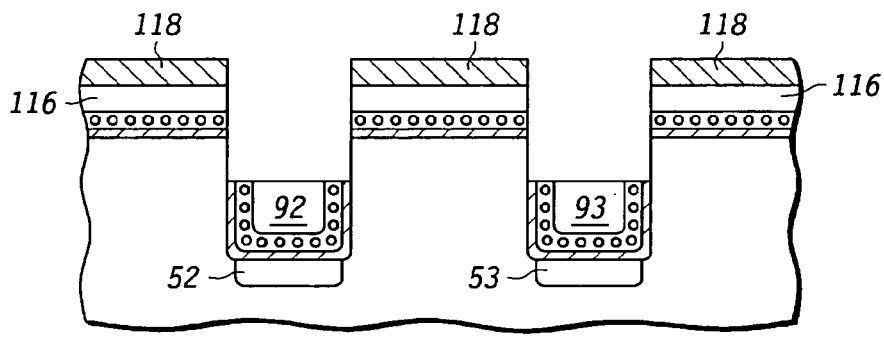
FIG. 11 includes an illustration of a cross-sectional view of the workpiece of FIG. 10 after removal of the remainder of the exposed portions of charge storage stack within the array.

Exposed portions of dielectric layer 66 are removed, exposing discontinuous storage elements 64, as illustrated in FIG. 10. Exposed discontinuous storage elements 64 are then removed, as illustrated in FIG. 11, or rendered incapable of storing charge (not illustrated). In one embodiment, a wet etch of exposed portions of dielectric layer 62 undercuts discontinuous storage elements 64, allowing them to be rinsed away. In one particular embodiment (not illustrated), discontinuous storage elements 64 are silicon crystals that are oxidized to form silicon dioxide. In one embodiment, at this point in the process, substantially no discontinuous storage elements 64 overlie primary surface 13 or along walls of trenches 22 and 23 that lie above the upper surfaces of gate electrodes 92 and 93 within NVM array 14.

Figure 12:
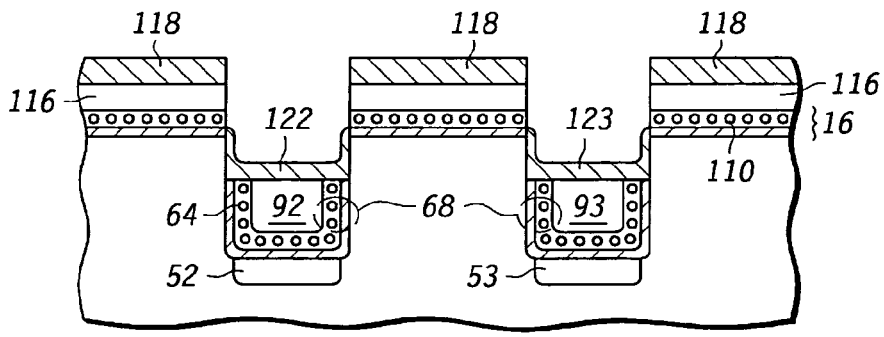
FIG. 12 includes an illustration of a cross-sectional view of the workpiece of FIG. 11 after formation of a dielectric layer including portions overlying gate electrodes within trenches.

An intergate dielectric layer including dielectric portions 122 and 123 is then formed over NVM array 14, as illustrated in FIG. 12. Dielectric portion 122 can overlie gate electrode 92 and dielectric portion 123 can overlie gate electrode 93. The intergate dielectric layer can include one or more dielectric films, any of which may be thermally grown or deposited. The intergate dielectric layer can include any one or more materials or be formed using any of the embodiments as described with respect to dielectric layer 18. The intergate dielectric layer can have the same or different composition compared to dielectric layer 18 and may be formed using the same or different formation technique compared to dielectric layer 18. The thickness of dielectric portions 122 and 123 can affect the electrical fields within the channel regions of the memory cells. The electrical field is designed to provide the highest change in electrical field within the channel region for each memory cell to allow for source-side injection. In one embodiment, the thickness of dielectric portions 122 and 123 is in a range of approximately 10 to approximately 30 nm. In a particular embodiment (not illustrated), dielectric portions 122 and 123 may contain oxidized portions of discontinuous storage elements 64.

At this point in the process, charge storage stack 68 includes a set of discontinuous storage elements 64, a portion of which lies within trench 22 and another portion of which lies within trench 23, and charge storage stack 16 includes another set of discontinuous storage elements 110 that overlie primary surface 13 of substrate 12. The set of discontinuous storage elements 110 are spaced apart from the set of discontinuous storage elements 64 that lie within trenches 22 and 23. In one embodiment, the set of discontinuous storage elements 110 are not contiguous with the set of discontinuous storage elements 64, and the sets are spaced apart from each other by dielectric portion 122 or 123.

Figure 13:
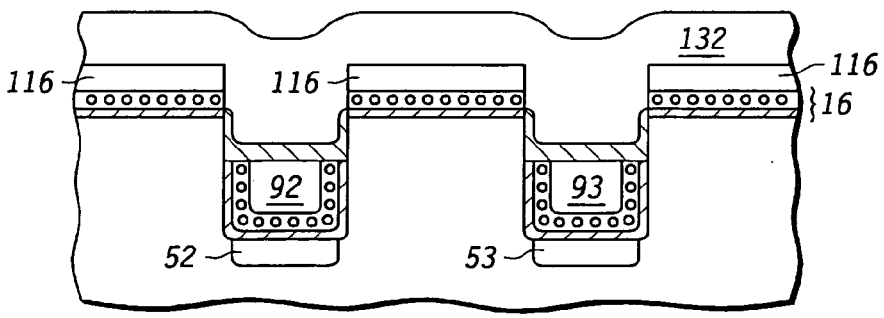
FIG. 13 includes an illustration of a cross-sectional view of the workpiece of FIG. 12 after formation of a conducting layer.

Conductive layer 132 is formed over NVM array 14, as illustrated in FIG. 13. Conductive layer 132 can be formed of one or more materials, following an embodiment previously described with respect to conducting layer 72. The material or technique used could be the same or different than the one used to form conducting layer 72. In one embodiment, the thickness of conductive layer 132 is in a range of approximately 20 to approximately 300 nm. In another embodiment, conductive layer 132 has a dopant concentration of at least approximately 1E19 atoms/cm$^3$ when conductive layer 132 includes polysilicon or amorphous silicon.

Figure 14:
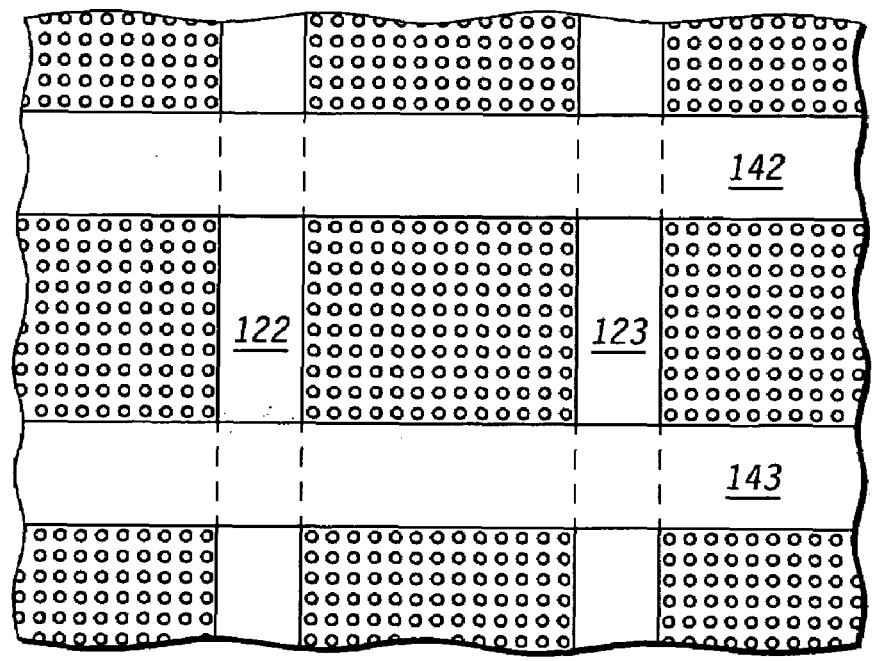
FIG. 14 includes an illustration of a top view of the workpiece of FIG. 13 after formation of conductive lines.

Conductive layer 132 is patterned by etching using a conventional technique to form conductive lines 142 and 143, which include gate electrodes, illustrated in FIG. 14. Conductive lines 142 and 143 can lie at least partly within trench 22, trench 23, one or more other trenches (not illustrated) within NVM array 14, or any combination thereof. In one embodiment, the lengths of conductive lines 142 and 143 are substantially perpendicular to the lengths of trenches 22 and 23 within NVM array 14. Optionally, a material capable of reacting with silicon to form a silicide (e.g., Ti, Ta, Co, W, Mo, Zr, Pt, other suitable material, or any combination thereof) is formed on conductive line 142 and 143 and reacted to form a metal silicide. In another embodiment, conductive lines 142 and 143 can be used as word lines for NVM array 14, with portions thereof acting as gate electrodes for plurality of bit cells. In another embodiment (not illustrated), exposed portions of charge storage stack 16 are removed. In a further embodiment, an insulating layer (not illustrated) may be formed overlying areas previously covered by portions of charge storage stack 16. Optionally, sidewall spacers may be formed adjacent to conductive lines 142 and 143.

In one embodiment, NVM array 14 is substantially complete. In one embodiment, peripheral electrical connections (not illustrated) are made to access conductive portions of NVM array 14. Protective layer 114 overlying the peripheral areas of substrate 12 can be removed, and another protective layer (not illustrated) can be formed over NVM array 14, which may protect NVM array 14 during component fabrication within the peripheral areas. Processing can be continued to form a substantially completed electronic device. One or more insulating layers, one or more conductive layers, and one or more encapsulating layers are formed using one or more conventional techniques.

In another embodiment, a different NVM array 14 layout and interconnect scheme may be used. In an embodiment, the process through formation of conductive layer 132 over all of NVM array 14 (FIGS. 1 through 13) can be performed using any embodiment as previously described.

Figure 15:
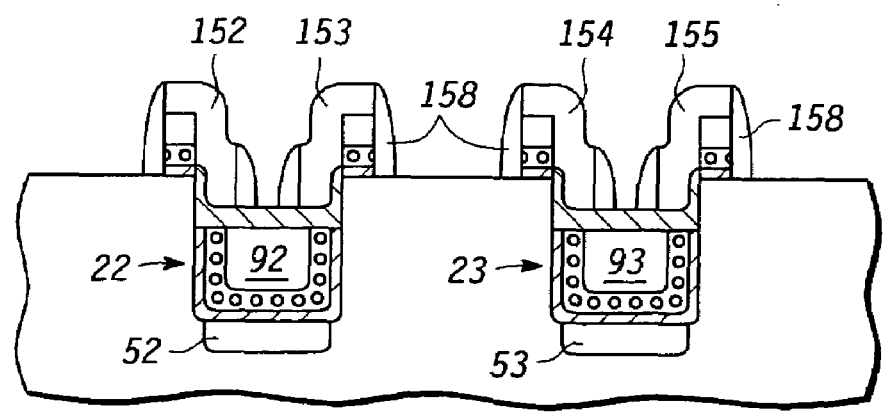
FIG. 15 includes an illustration of a cross-sectional view of the workpiece of FIG. 12 after formation of conductive lines in accordance with an alternative embodiment.

Conductive layer 132 can be patterned and etched to form conductive lines 152 through 155, as illustrated in FIG. 15. The conductive lines 152 through 155 can act as word lines in the NVM array 14. The lengths of conductive lines 152 through 155 are substantially parallel to the lengths of trenches 22 and 23. In one embodiment, portions of conductive lines 152 through 155 can lie within the recesses of trenches 22 and 23. The composition and method of formation of conductive lines 152 through 155 may be any of those described with respect to formation of conductive lines 142 and 143. In one embodiment (not illustrated), exposed portions of charge storage stack 16 can be removed. Optionally, an insulating layer (not illustrated) may be formed over exposed portions of primary surface 13 of substrate 12 and along exposed surfaces of conductive lines 142 and 143. Optionally, sidewall spacers 154 may be formed adjacent to conductive lines 152 through 155.

Figure 16:
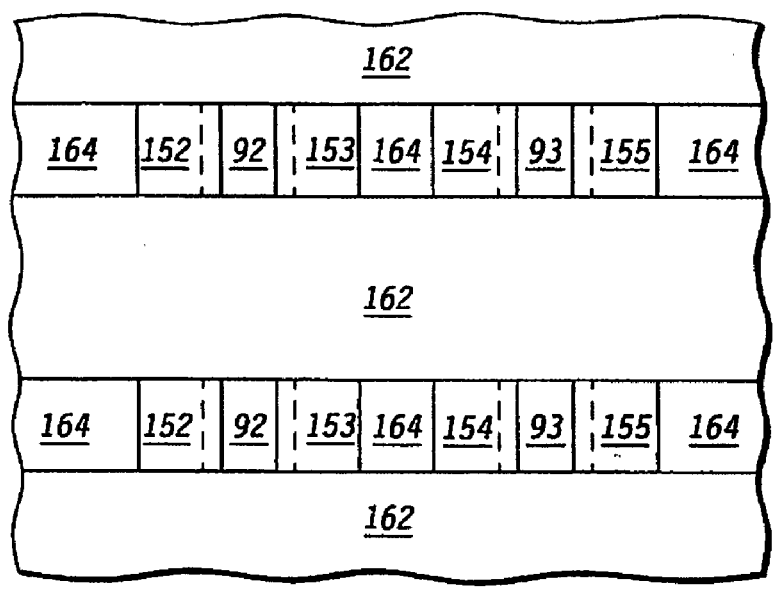
FIG. 16 includes an illustration of a top view of the workpiece of FIG. 15 after formation of an implant masking layer.

Patterned resist layer 162, as illustrated in FIG. 16, is formed over the workpiece. In one embodiment, openings in patterned resist layer 162 substantially correspond to locations over which bit lines will subsequently be formed. In one embodiment, one or more features overlying substrate 12 may or may not be removed between conductive lines 152 through 155. A dopant is introduced into portions of substrate 12 to form doped regions 164. Doped regions 164 may be formed by an embodiment previously described for formation of doped regions 52 and 53. Doped regions 164 can be the same or different material as doped regions 52 and 53 and can be formed by the same or different technique. Patterned resist layer 162 is then removed by a conventional technique. In one embodiment, each of doped regions 164 has a dopant concentration of at least approximately 1E19 atoms/cm$^3$. In a particular embodiment, in a finished device, portions of doped regions 164 serve as S/D regions.

In one embodiment, NVM array 14 is now substantially complete other than electrical connections. Remaining portions of protective layer 114 (not illustrated in FIG. 16) that overlie the peripheral areas of substrate 12 are removed, and another protective layer (not illustrated) can be formed over NVM array 14 which may protect NVM array 14 during component fabrication within the peripheral areas. Component fabrication within the peripheral areas can be performed using one or more conventional techniques. After the component fabrication within the peripheral areas is substantially completed, the protective layer overlying NVM array 14 can be removed.

Figure 17:
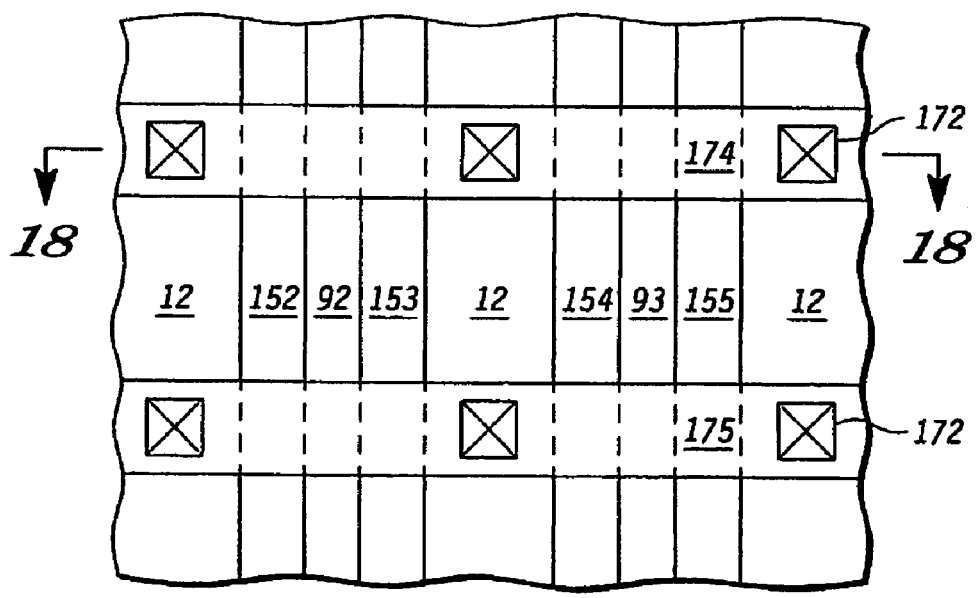
FIGS. 17 and 18 include illustrations of a top view and a cross-sectional view, respectively of the workpiece of FIG. 16 after fabrication of an electronic device is substantially completed.
Figure 18:
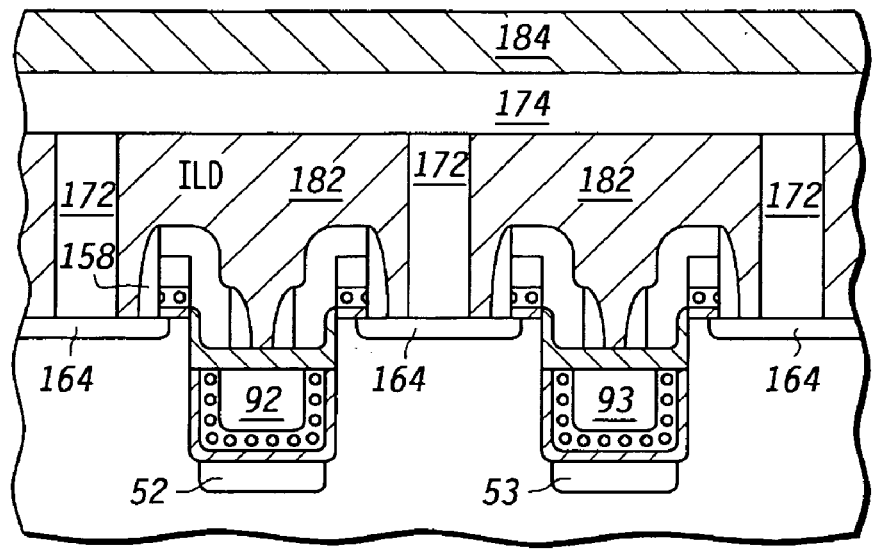

Processing is continued to form the substantially completed electronic device, as illustrated in FIGS. 17 and 18. An interlevel dielectric layer 182 is formed over the workpiece by a conventional technique. Interlevel dielectric layer 182 is patterned to form contact openings that extend to doped regions 164 and to other portions of NVM array 14 that are not illustrated in FIGS. 17 and 18. Interlevel dielectric layer 182 can include an insulating material, such as an oxide, a nitride, an oxynitride, or a combination thereof. In a specific embodiment, an anisotropic etch can be used to form contact openings.

Conductive plugs 172 and conductive lines 174 and 175 are then formed, as illustrated in FIG. 17. The lengths of conductive lines 174 and 175 are substantially perpendicular to the lengths of conductive lines 152 and 153. In one embodiment, conductive lines 174 and 175 are bit lines for NVM array 14, and conductive plugs 172 are bit line contacts. Although not illustrated in FIG. 17, doped regions 164 underlie conductive lines 174 and 175 between portions of substrate 12 not covered by conductive lines 174 and 175.

In one embodiment, conductive plugs 172 are formed prior to conductive lines 174 and 175. In one particular embodiment, a conductive layer (not illustrated) is formed over interlevel dielectric layer 182 and substantially fills contact openings therein. Portions of the conductive layer that lie outside the contact openings are removed to form conductive plugs 172. In one embodiment, a conventional chemical-mechanical polishing operation can be performed, and in another embodiment, a conventional etching process can be performed.

Another insulating layer (not illustrated) is then deposited and patterned to form trenches where conductive lines 174 and 175 will subsequently be formed. Other trenches can be formed at locations within NVM array 14, outside NVM array 14, or a combination thereof. In one embodiment, another conductive layer is formed over interlevel dielectric layer 182 and substantially fills the trenches in the insulating layer. Portions of the conductive layer that lie outside the trenches within the insulating layer are removed to form conductive lines 174 and 175. In one embodiment, a conventional chemical-mechanical polishing operation can be performed, and in another embodiment, a conventional etching process can be performed. Although not illustrated in FIGS. 17 and 18, the insulating layer can lie at substantially the same elevation between conductive lines 174 and 175. In another embodiment (not illustrated), conductive plugs 172 and conductive lines 174 and 175 are formed concurrently using a conventional dual-inlaid process.

Conductive plugs 172 and conductive lines 174 and 175 can include the same or different conducting materials. Each of conductive plugs 172 and conductive lines 174 and 175 can include doped silicon, tungsten, titanium, tantalum, titanium nitride, tantalum nitride, aluminum, copper, another suitable conductive material, or any combination thereof. In one particular embodiment, conductive plugs 172 include tungsten, and conductive lines 174 and 175 include copper. An optional barrier layer, adhesion layer, or a combination thereof may be formed before the corresponding conductive layers (e.g., tungsten for conductive plugs 172 and copper for conductive lines 174 and 175). An optional capping layer (e.g., a metal-containing nitride) may be used to encapsulate copper within conductive lines 174 and 175.

In another embodiment (not illustrated), additional insulating and conductive layers can be formed and patterned to form one or more additional levels of interconnects. After the last interconnect level has been formed, passivation layer 184 is formed over substrate 12, including NVM array 14 and peripheral areas. Passivation layer 184 can include one or more insulating film, such as an oxide, a nitride, an oxynitride, or a combination thereof.

In another embodiment, yet another NVM array 14 layout and interconnect scheme may be used. In this embodiment, the process through formation of conductive lines 142 and 143 (FIG. 14) can be performed using any embodiment as previously described with respect to FIGS. 1 to 14. In one embodiment, remaining portions (not illustrated) of protective layer 114 that overlie the peripheral areas of substrate 12 are removed, and another protective layer (not illustrated) can be formed over NVM array 14 which may protect NVM array 14 during component fabrication within the peripheral areas. Component fabrication within the peripheral areas can be performed using one or more conventional techniques. After the component fabrication within the peripheral areas is substantially completed, the protective layer overlying NVM array 14 can be removed.

Figure 19:
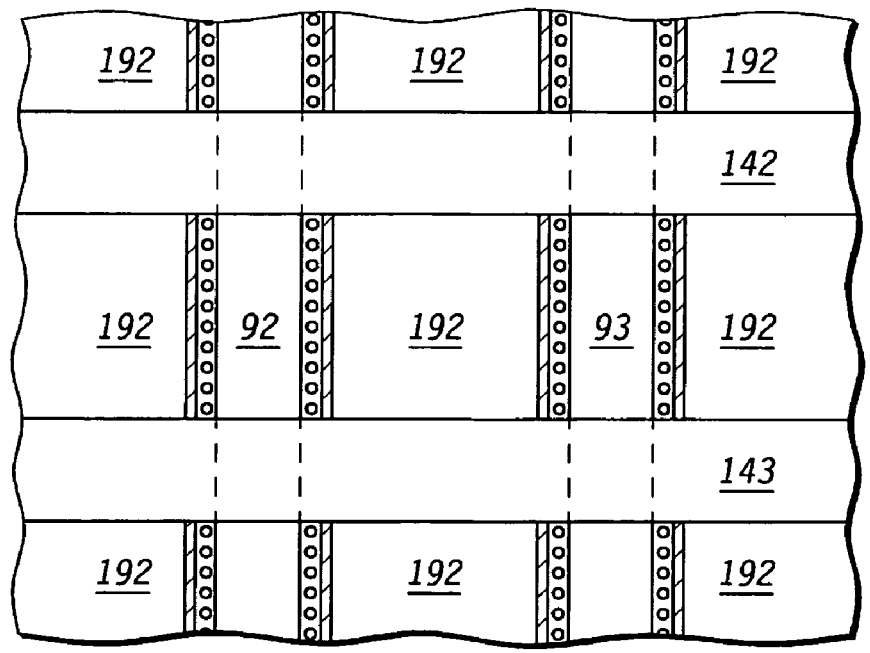
FIG. 19 includes an illustration of a top view of the workpiece of FIG. 14 after formation of doped regions within the substrate.

In one embodiment, the remainder of processing for the peripheral areas and NVM array 14 can occur substantially simultaneously. After forming conductive lines 142 and 143 and other conductive lines that include gate electrodes in NVM array 14 and peripheral areas, exposed portions of charge storage stack 16 may be removed. An insulating layer (not illustrated) may be formed overlying primary surface 13 of substrate 12 and along exposed surfaces of conductive lines 142 and 143. A dopant is introduced into substrate 12 to form doped regions 192 at locations between conductive lines 142 and 143 and outside and adjacent to trenches 22 and 23, as illustrated in FIG. 19. Doped regions 192 can include any one or more materials or be formed using any of the embodiments as described with respect to doped regions 52 and 53. The insulating layer can have the same or different composition compared to doped regions 52 and 53 and may be formed using the same or different formation technique compared to doped regions 52 and 53. Optionally, spacers (not illustrated) may be formed adjacent to conductive lines 142 and 143 before, after, or between individual actions used in forming doped regions 192. In one specific embodiment, the optional sidewall spacers can be formed as previously described regarding other embodiments. In one embodiment, doped regions 192 can serve as S/D regions in the finished device. In a particular embodiment, each of doped regions 192 has a dopant concentration of at least approximately $1E19$ atoms/cm$^3$. Optionally, a metal silicide can be formed from portions of conductive lines 142 and 143, doped regions 192, or any combination thereof using a conventional technique.

Figure 20:
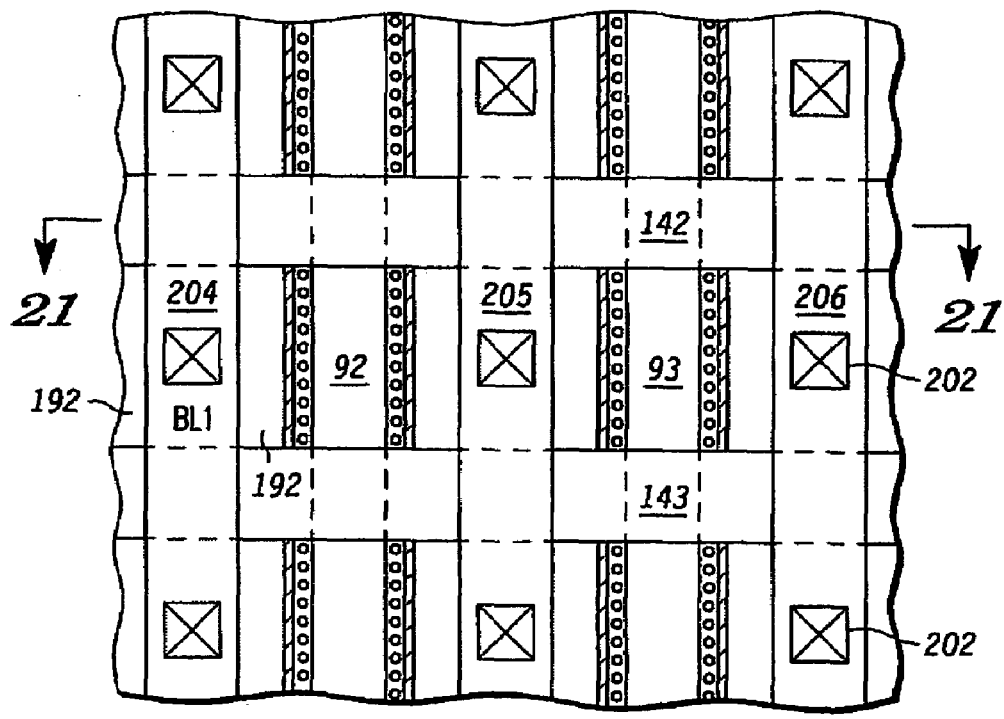
FIGS. 20 and 21 include illustrations of a top view and a cross-sectional view, respectively, of the workpiece of FIG. 19 after fabrication of an electronic device is substantially completed.
Figure 21:
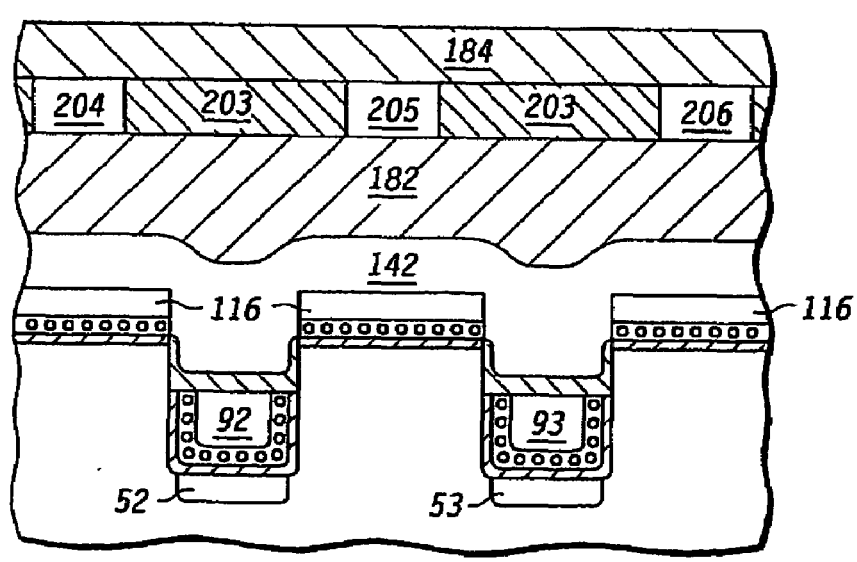

Interlevel dielectric layer 182 is then formed with contact openings using any of the embodiments as previously described. Referring to FIGS. 20 and 21, conductive plugs 202 are then formed using any embodiment as previously described for conductive plugs 172. The locations of the contact openings are changed as compared to a prior embodiment in that contact openings extend to doped region 192. Insulating layer 203 can be formed by depositing an insulating material and patterned to define interconnect trenches. Conductive lines 204 through 206 are then formed within the interconnect trenches using any embodiment as previously described for conductive lines 174 and 175. Conductive lines 204 through 206 can serve as bit lines within NVM array 14. The orientation of conductive lines 204 through 206 is different from the orientation of conductive lines 174 and 175. The lengths of conductive lines 204 through 206 are substantially perpendicular to the lengths of conductive lines 142 and 143, as illustrated in FIG. 20.

In another embodiment (not illustrated), additional insulating and conductive layers can be formed and patterned to form additional levels of interconnects. After the last interconnect level has been formed, passivation layer 184 is formed over substrate 12, including NVM array 14 and peripheral areas. Passivation layer 184 can include one or more insulating film, such as an oxide, a nitride, an oxynitride, or a combination thereof.

In another embodiment, still another NVM array 14 layout and interconnect scheme may be used. The layout and interconnect scheme is similar to an embodiment as illustrated in FIGS. 1 through 13 and 18 through 20 except that a virtual ground array architecture is used, rather than conductive lines 194 through 196. The layout and organization will become more apparent after reading the description below with respect to FIGS. 22 to 25.

Figure 22:
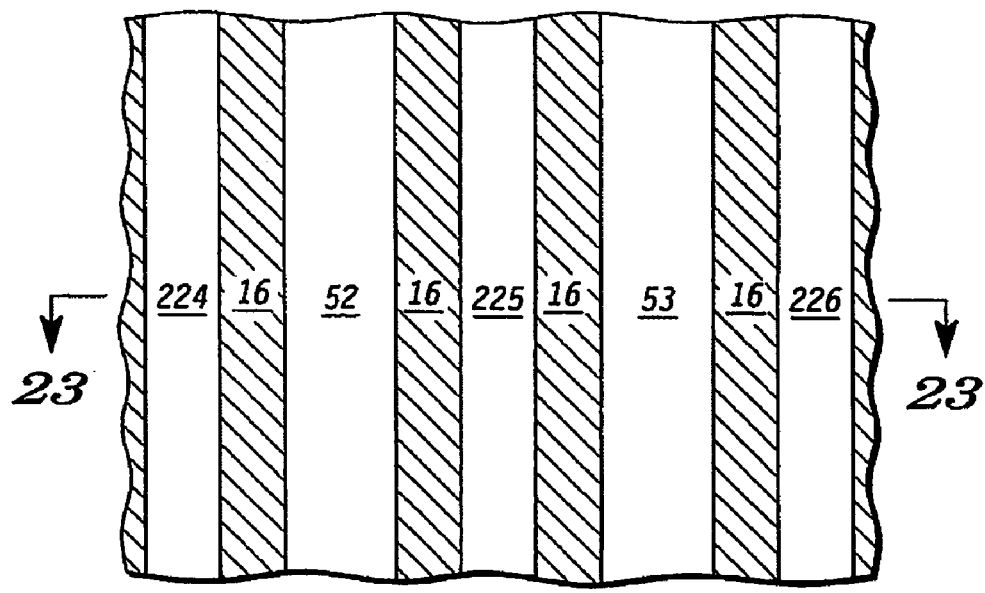
FIGS. 22 and 23 include illustrations of a top view and a cross-sectional view, respectively, of the workpiece of FIG. 13 after formation of doped regions within the substrate.
Figure 23:
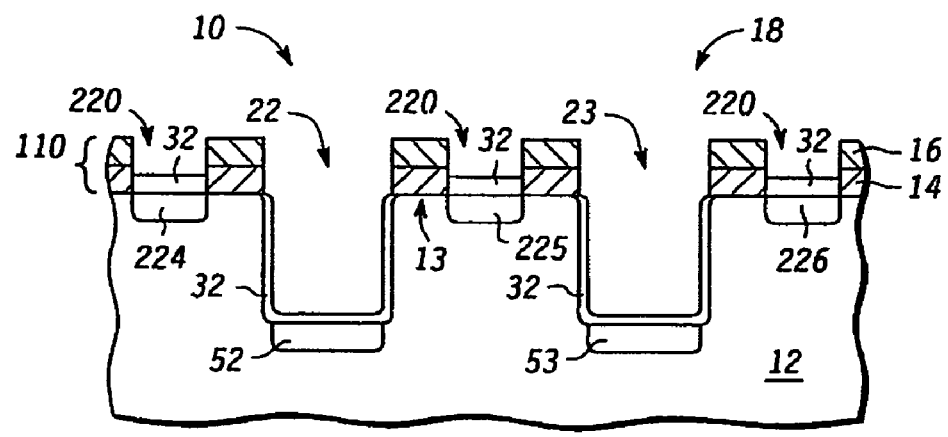

Relatively early in the process, openings 220 are formed within the protective layer 110, and doped regions 224, 225, and 226 are formed along primary substrate 13 of substrate 12 outside trenches 22 and 23, as illustrated in FIGS. 22 and 23, which are similar to FIGS. 4 and 5, respectively. Openings 220 and doped regions 224, 225, and 226 can be formed using one or more conventional techniques. Openings 220 can be formed before or after forming trenches 22 and 23. For example, all openings within protective layer 110 may be formed at substantially simultaneously. A mask (not illustrated) can be formed over opening 220 to substantially prevent forming a trench below openings 220. The mask can be removed after forming trenches 22 and 23. In another embodiment, a different mask (not illustrated) may be formed over openings 220 after trenches 22 and 23 have been formed, and the different mask can be removed after forming openings 220. Insulating layer 32 can be formed along the bottoms of openings 220 in a manner similar to the embodiment described with respect to FIG. 3.

Doped regions 224, 225, and 226 can be formed using any one or more of the embodiments as described with respect to doped regions 52 and 53. The dopant species, concentration, and profile and formation of doped regions 224, 225, and 226 may be the same or different as compared to doped regions 52 and 53. In one embodiment, doped regions 224, 225, and 226 can be formed substantially simultaneously with doped regions 52 and 53. Each of doped regions 52, 53, 224, 225, and 226 have lengths that are substantially parallel to one another and can act as buried bit lines. Doped regions 52 and 53 lie at elevations deeper within substrate 12, as compared to doped regions 224, 225, and 226.

In still another embodiment (not illustrated), openings 220 are not formed. Instead, after forming trenches 22 and 23, remaining portions of protective layer 110 within NVM array 14 are removed before forming insulating layer 32. Doped regions 224, 225, and 226 can be formed when doped regions 52 and 53 are formed. Doped regions 224, 225, and 226 can extend to walls of trenches 22 and 23.

Figure 24:
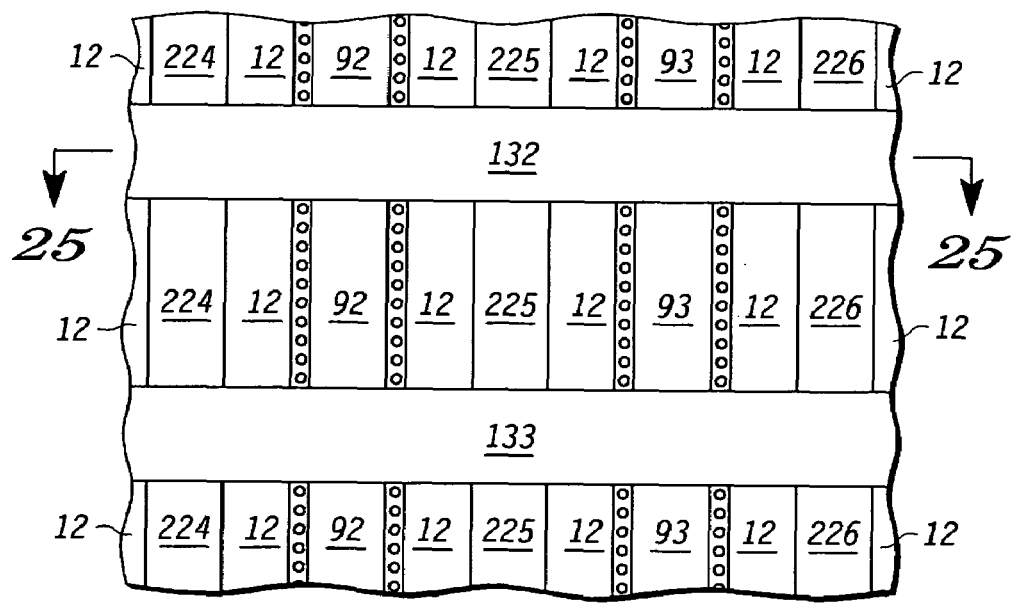
FIGS. 24 and 25 include illustrations of a top view and a cross-sectional view, respectively, of the workpiece of FIGS. 22 and 23 after fabrication of an electronic device is substantially completed.
Figure 25:
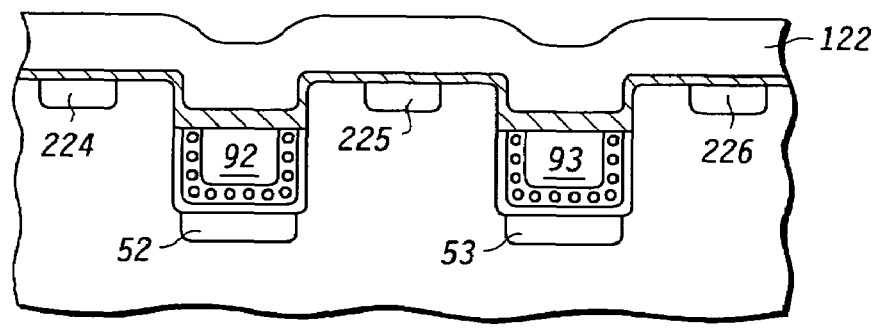

After doped regions 52, 53, 224, 225, and 226 are formed using any one or combination of embodiments described above, processing is continued using any one or more of the embodiments as described with respect to FIGS. 6 through 13. FIGS. 24 and 25 include illustrations of a portion of NVM array 14 are formation of the NVM array is substantially completed. As compared to the conductive lines 194 through 196 in FIGS. 19 and 20, doped regions 224 through 226 can be used in place of conductive lines 194 to 196.

In one embodiment, peripheral electrical connections (not illustrated) are made to access conductive portions of NVM array 14. Protective layer 110 overlying the peripheral areas of substrate 12 can be removed, and another protective layer (not illustrated) can be formed over NVM array 14, which may protect NVM array 14 during component fabrication within the peripheral areas. Processing can be continued to form a substantially completed electronic device. One or more insulating layers, one or more conductive layers, and one or more encapsulating layers are formed using one or more conventional techniques.

In another embodiment, still another NVM array 14 layout and interconnect scheme may be used. The layout and interconnect scheme is similar to an embodiment as illustrated in FIGS. 1 to 14 and 19 to 21 except that a plurality of bit lines lie between trenches 22 and 23, and electrical connections are made between the bit lines and only some of the doped regions underlying the bit lines. The layout and organization will become more apparent after reading the description below with respect to FIGS. 26 to 29.

Figure 26:
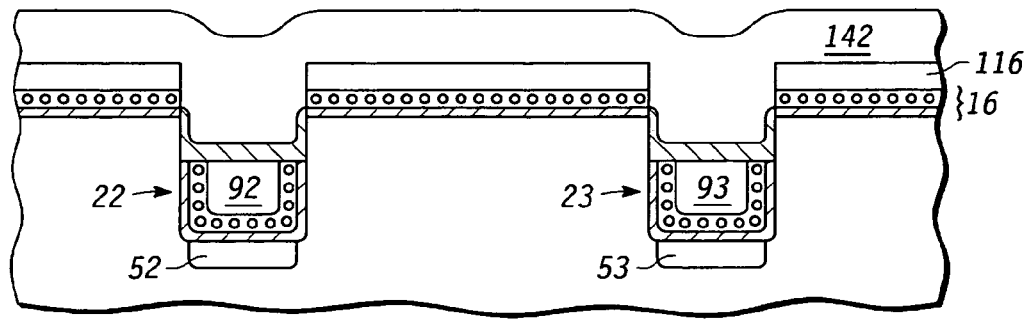
FIG. 26 includes an illustration of a cross-sectional view of the workpiece of FIGS. 13 except with trenches that are more widely spaced apart from each other.

In this embodiment, the process through formation of conductive lines 142 and 143 (FIG. 14) can be performed using any embodiment as previously described with respect to FIGS. 1 to 14. In one embodiment, the space between trenches 22 and 23 may be increased to allow for the proper formation of bit lines and contacts consistent with the design rules, as illustrated in FIG. 26. In another embodiment, remaining portions (not illustrated) of protective layer 114 that overlie the peripheral areas of substrate 12 are removed, and another protective layer (not illustrated) can be formed over NVM array 14 which may protect NVM array 14 during component fabrication within the peripheral areas. Component fabrication within the peripheral areas can be performed using one or more conventional techniques. After the component fabrication within the peripheral areas is substantially completed, the protective layer overlying NVM array 14 can be removed.

Figure 27:
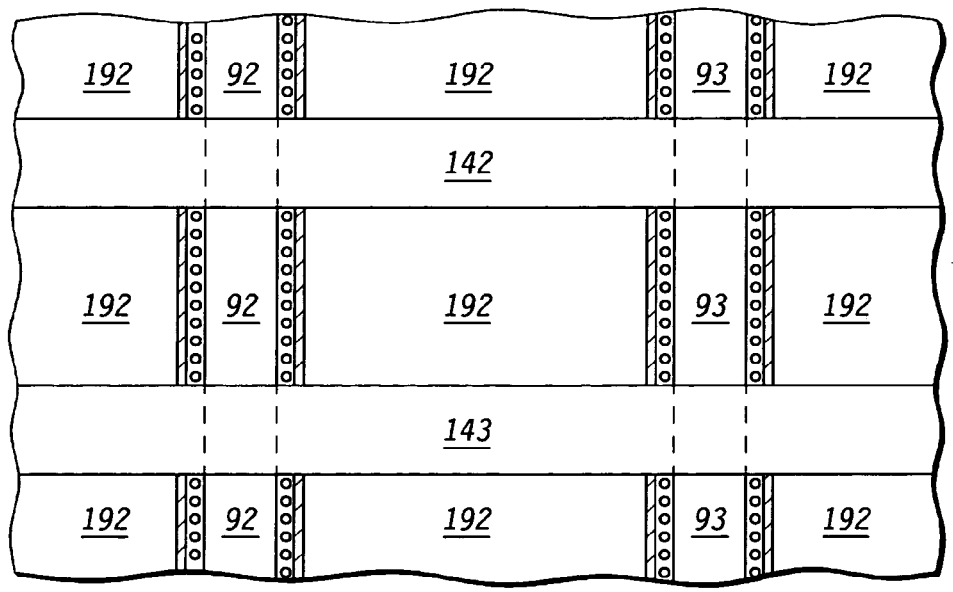
FIG. 27 includes an illustration of a top view of the workpiece of FIG. 26 after formation of overlying conducting lines.
Figure 28:
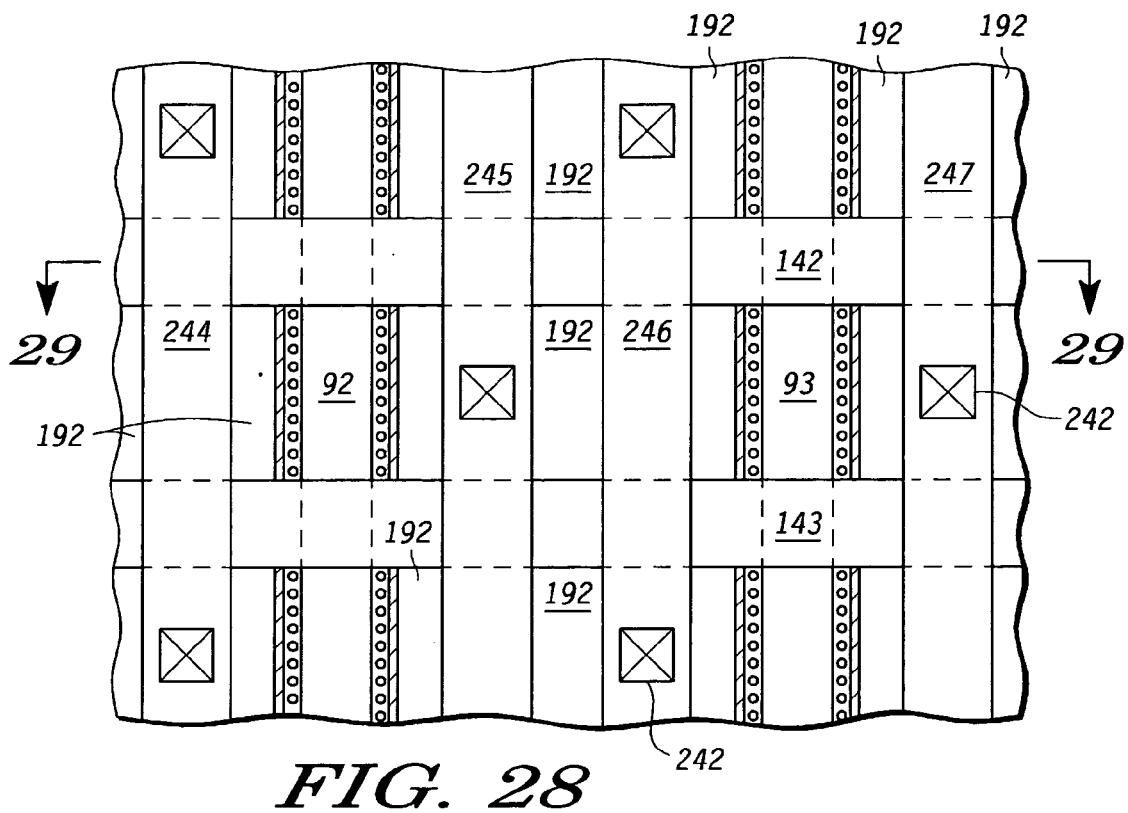
FIGS. 28 and 29 include illustrations of a top view and a cross-sectional view of the workpiece of FIG. 27 after fabrication of an electronic device is substantially completed.
Figure 29:
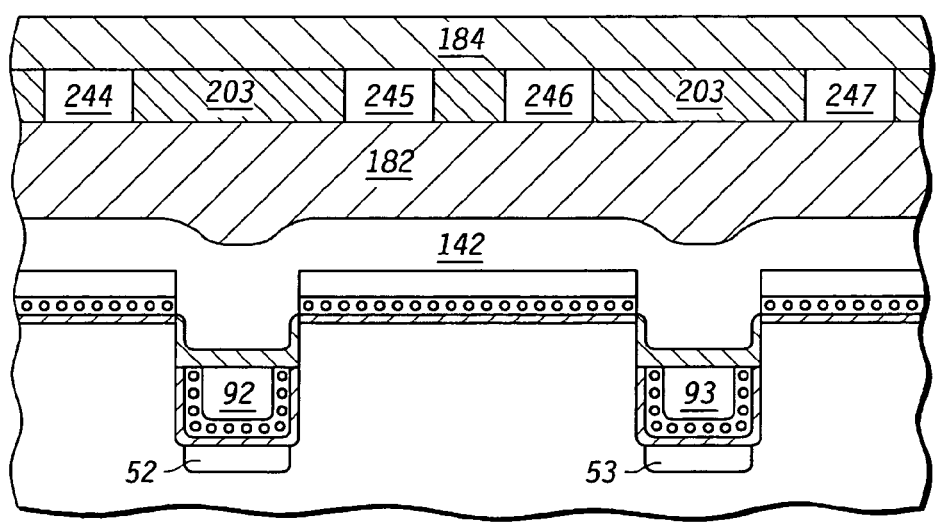

Doped regions 192 and conductive lines 142 and 143 are formed by a previously described embodiment, as illustrated in FIG. 27. Conductive plugs 242, conductive lines 244 through 247, as illustrated in FIGS. 27 and 28, are formed using an embodiment previously described with respect to formation and patterning of conductive plugs 202 and conductive lines 204 through 206. Conductive lines 244 through 247 can serve as bit lines within NVM array 14. The locations of conductive plugs 242 and conductive lines 244 through 247 are different from those illustrated for conductive plugs 202 and conductive lines 204 through 206, respectively. The orientation of conductive lines 244 through 247 is substantially the same as the orientation of conductive lines 204 through 206. Unlike conductive lines 204 through 206, each of conductive lines 244 through 247 has electrical connections via conductive plugs 242 to only some of the underlying doped regions 192. In one particular embodiment, the electrical connections to underlying doped regions 192 are alternated between conductive lines 245 and 246. Referring to FIG. 27, conductive line 245 is electrically connected to the middle row of doped regions 192, and a conductive line 246 is electrically connected to the top and bottom rows of doped regions 192.

In another embodiment (not illustrated), additional insulating and conductive layers can be formed and patterned to form additional levels of interconnects. After the last interconnect level has been formed, passivation layer 184 is formed over substrate 12, including NVM array 14 and peripheral areas. Passivation layer 184 can include one or more insulating film, such as an oxide, a nitride, an oxynitride, or a combination thereof.

Figure 30:
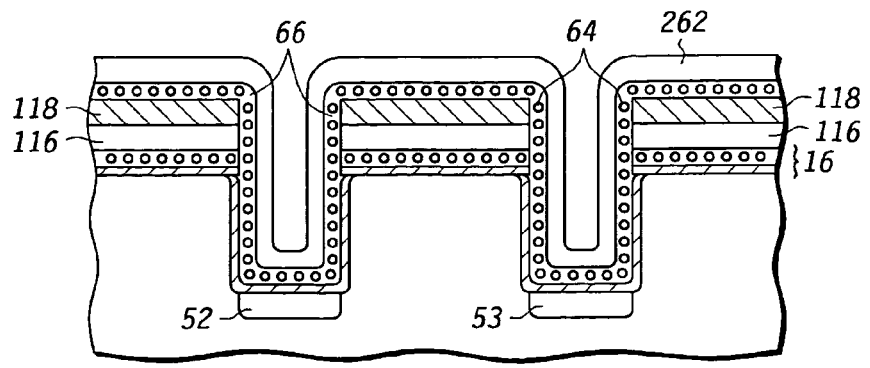
FIGS. 30 includes an illustration of a cross-sectional view of the workpiece of FIG. 6 after formation of a conductive layer.

In another alternative embodiment, the gate electrodes within trenches 22 and 23 can have a shape similar to a sidewall spacer. The process may start with the workpiece as illustrated in FIG. 6. Conductive layer 262 can be deposited as illustrated in FIG. 30. In one embodiment, conductive layer 262 is a relatively thinner, substantially conformal layer. Conductive layer 262 can be formed using any one or more embodiments as described with respect to conductive layer 72. The thickness of conductive layer 262 is insufficient to fill in trenches 22 and 23 within NVM array 14. In one embodiment, the thickness of conductive layer 262 is in a range of approximately 10 nm to approximately 100 nm.

Figure 31:
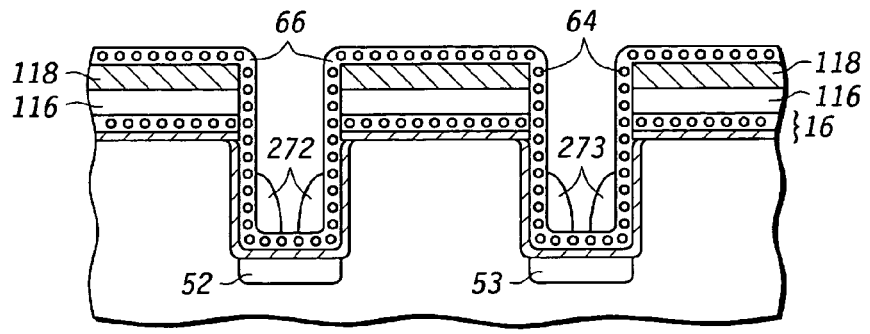
FIGS. 31 includes an illustration of a cross-sectional view of the workpiece of FIG. 30 after formation of gate electrodes.

An anisotropic etch of conductive layer 262 can then form gate electrodes 272 and 273 illustrated in FIG. 31. When formed, gate electrodes 272 and 273 can have substantially sidewall spacer shapes within trenches 22 and 23. Although a top view is not illustrated, gate electrodes 272 and 273 are annular when initially formed, in that each of gate electrodes 272 and 273 lies along the perimeter of trenches 22 and 23. Thus, the spaced-apart left and right portions with facing curved surfaces for each of gate electrodes 272 and 273 within each of trenches 22 and 23 are connected to each other. The processing of NVM array 14 can then be completed as previously described for other embodiments. In one embodiment, when conductive lines 142 and 143 are formed, an additional isotropic etch portion may be used to reduce the likelihood of forming an unintended electrical connection or leakage path between subsequently-formed conductive lines 142 and 143.

After reading this specification, skilled artisans will appreciate that many variations regarding doping portions of the substrate 12 can be used. Doped regions that are at least part of source/drain regions for the memory cells within NVM array 18 have an opposite conductivity type as compared to substrate 12. The portion of substrate 12 as illustrated in the figures may or may not lie within one or more well regions. Such well region(s) may be different from one or more other well regions within peripheral areas (outside NVM array 18). Other doping can be performed that may affect breakdown voltages, resistivity, threshold voltage, hot carrier generation, one or more other electrical characteristics, or any combination thereof. Skilled artisans will be able to form electronic devices having doping characteristics that meet their needs or desires.

NVM array 14 can include memory cells using any of the layouts as previously described. Circuit schematics and cross references to physical embodiments are described to illustrate better how memory cells within NVM array 14 can be electrically configured and programmed.

Figure 32:
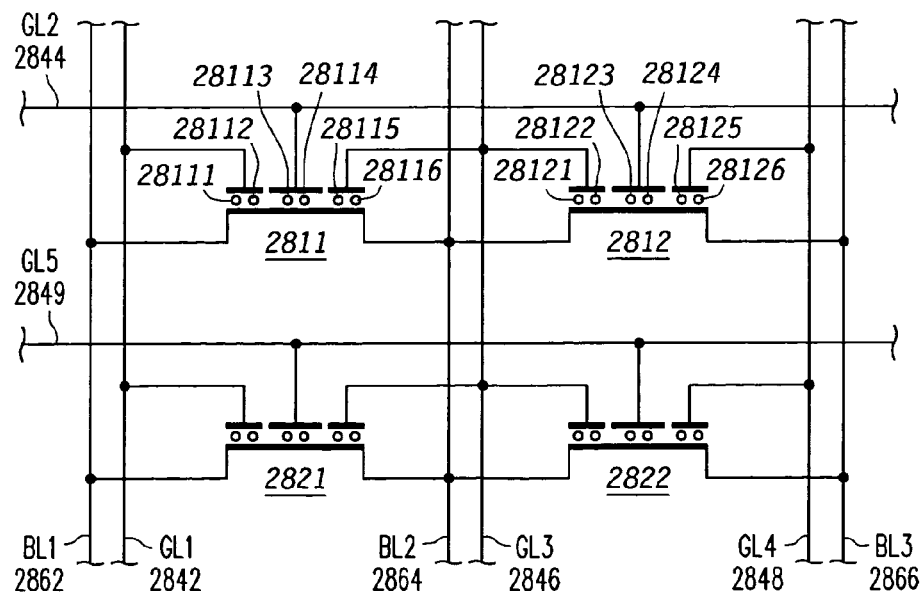
Figures 33, 34:
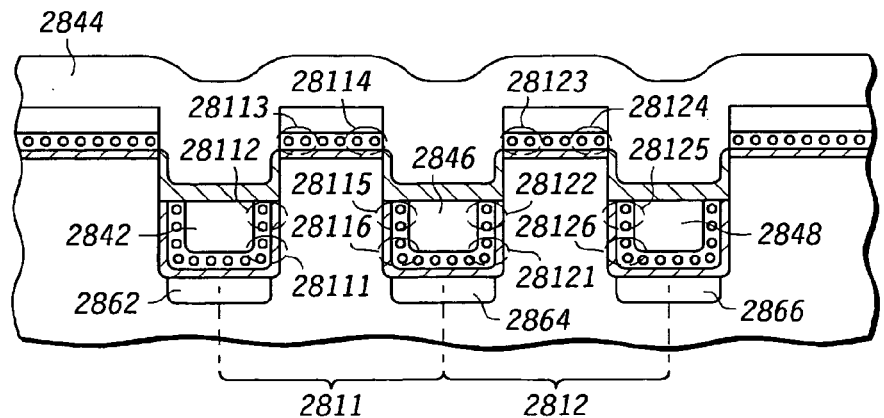

FIG. 32 includes a circuit schematic for an embodiment as described with respect to the embodiment as illustrated in FIG. 33. Memory cells 2811, 2812, 2821, and 2822 are oriented within NVM array 14, as illustrated in FIG. 32. In the figures, "BL" refers to a bit line, and "GL" refers to a gate line. Depending on biasing conditions, a GL can be a control gate line or a select gate line, depending on the biasing conditions.

Referring to FIG. 32, BL1 2862 is electrically connected to a S/D region of memory cell 2811 and a S/D region of memory cell 2821. BL2 2864 is electrically connected to the other S/D regions of memory cells 2811 and 2821 and to a S/D region of memory cell 2812 and a S/D region of memory cell 2822. BL3 2866 is electrically connected to the other S/D regions of memory cells 2812 and 2822. GL1 2842 is electrically connected to a gate electrode of memory cell 2811 and a gate electrode of memory cell 2821. GL2 2844 is electrically connected to gate electrodes of memory cells 2811 and 2812. GL3 2846 is electrically connected to other gate electrodes of memory cells 2811 and 2821 and to a gate electrode of memory cell 2812 and a gate electrode of memory cell 2822. GL4 2848 is electrically connected to gate electrodes of memory cells 2812 and 2822. GL5 2805 is electrically connected to other gate electrodes of memory cells 2821 and 2822. Each of GL2 2844 and GL5 2849 are electrically connected to gate electrodes that each include a control gate portion and a select gate portion. In one particular embodiment, such gate electrodes each include a control gate portion between two select gate portions.

FIG. 33 illustrates a physical embodiment of a portion of NVM array 14 corresponding to the row that includes memory cells 2811 and 2812. FIG. 33 is a cross-sectional illustration of the workpiece of FIG. 12 labeled with the same reference numbers those used in the circuit schematics in FIG. 33.

Charge storage regions for memory cells 2811 and 2812 are illustrated in FIGS. 32 and 33. Memory cell 2811 includes charge storage regions 28111 to 28114, and memory cell 2812 includes charge storage region 28121 to 28124. Memory cells 2821 and 2822 include similar charge storage regions, but such charge storage regions are not specifically identified in FIG. 32.

FIG. 34 includes a table that has some of the operating voltages for memory cells, as illustrated in FIG. 32. "Pgm" means program. References to charge storage regions 28111, 28112 28113, 28114, 28115, and 28116 refer to memory cell 2811, and more particularly to programming or reading discontinuous storage elements under gate electrodes of memory cell 2811. While many voltages are given in the table in FIG. 34 and other tables within this specification, other voltages may be used. The relative values and ratios between the voltages, rather than their absolute values are more relevant, as the absolute values of voltages change with changes in physical parameters.

All memory cells, as illustrated in FIG. 32 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Figure 35:
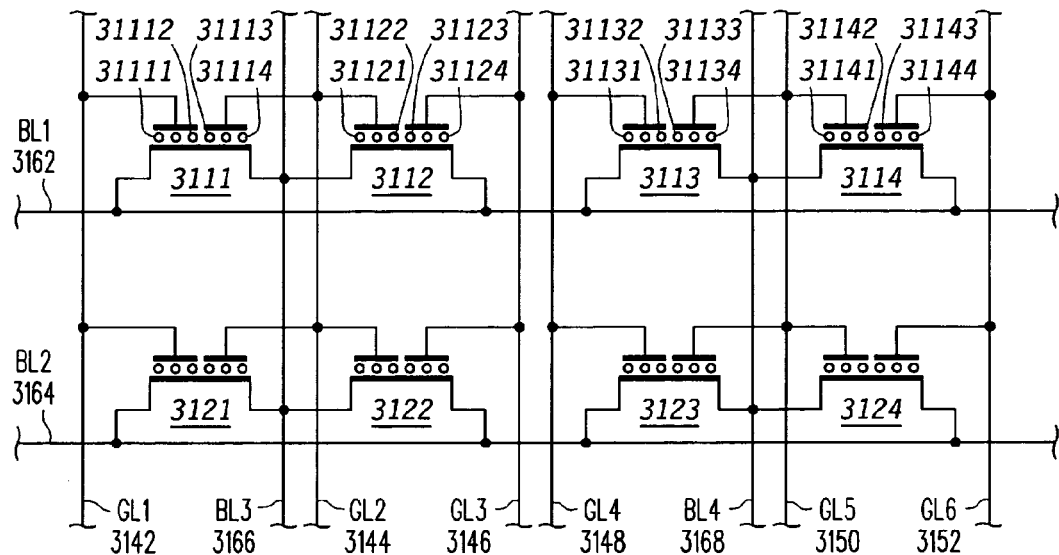
Figure 36:
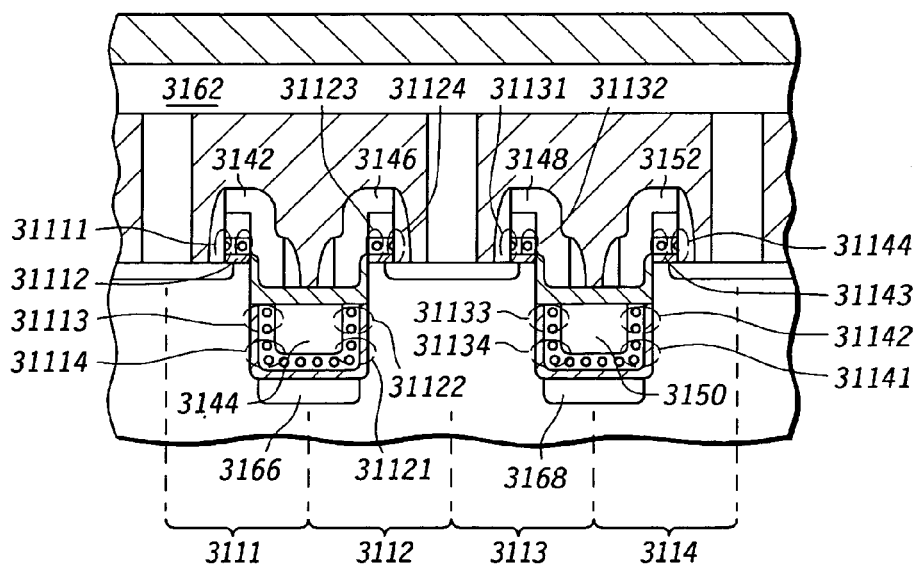

FIG. 35 includes a circuit schematic for an embodiment as described with respect to the embodiment as illustrated in FIG. 36. Memory cells 3111, 3112, 3113, 3114, 3121, 3122, 3123, and 3124 are oriented within NVM array 14, as illustrated in FIG. 35.

Referring to FIG. 35, BL1 3162 is electrically connected to a S/D region of memory cells 3111, 3112, 3113, and 3114. BL2 3164 is electrically connected to a S/D region of memory cells 3121, 3122, 3123, and 3124. BL3 3166 is electrically connected to the other S/D regions of memory cells 3111, 3112, 3121, and 3122. BL4 3168 is electrically connected to the other S/D regions of memory cells 3113, 3114, 3123, and 3124. GL1 3142 is electrically connected to select gate electrodes of memory cells 3111 and 3121. GL2 3144 is electrically connected to control gate electrodes of memory cell 3111, 3112, 3121, and 3122. GL3 3146 is electrically connected to select gate electrodes of memory cells 3112 and 3122. GL4 3148 is electrically connected to select gate electrodes of memory cells 3113 and 3123. GL5 3150 is electrically connected to control gate electrodes of memory cells 3113, 3114, 3123, and 3124. GL6 3152 is electrically connected to select gate electrodes of memory cells 3114 and 3124. Each of GL1 3142, GL3 3146, GL4 3148, and GL6 3152 are electrically connected to gate electrodes that each include a control gate portion and a select gate portion.

FIG. 36 illustrates a physical embodiment of a portion of NVM array 14 corresponding to the row that includes memory cells 3111, 3112, 3113, and 3114. FIG. 36 is substantially the same as FIG. 17 except that reference numbers as used in the circuit schematics are used in FIG. 36.

Charge storage regions for memory cells 3111 through 3114 are illustrated in FIGS. 35 and 36. Memory cell 3111 includes charge storage regions 31111 to 31114, memory cell 3112 includes charge storage region 31121 to 31124, memory cell 3113 includes charge storage region 31131 to 31134, and memory cell 3114 includes charge storage region 31141 to 31144. Memory cells 3121 through 3124 include similar charge storage regions, but such charge storage regions are not specifically identified in FIG. 36.

FIG. 37 includes a table that has some of the operating voltages for memory cells, as illustrated in FIG. 35.

All memory cells, as illustrated in FIG. 35 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Figure 38:
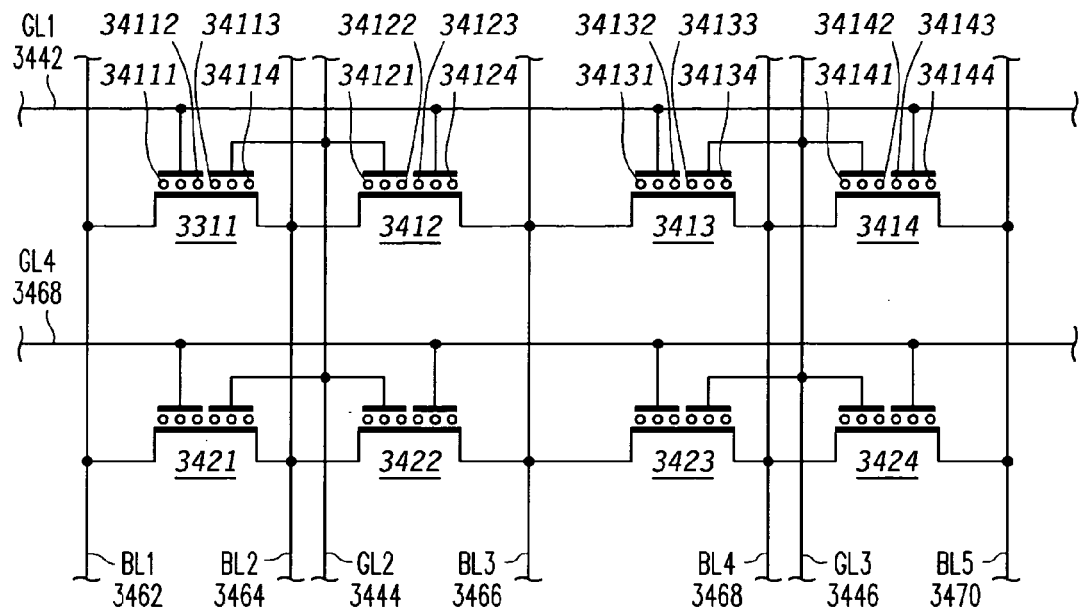
Figure 39:
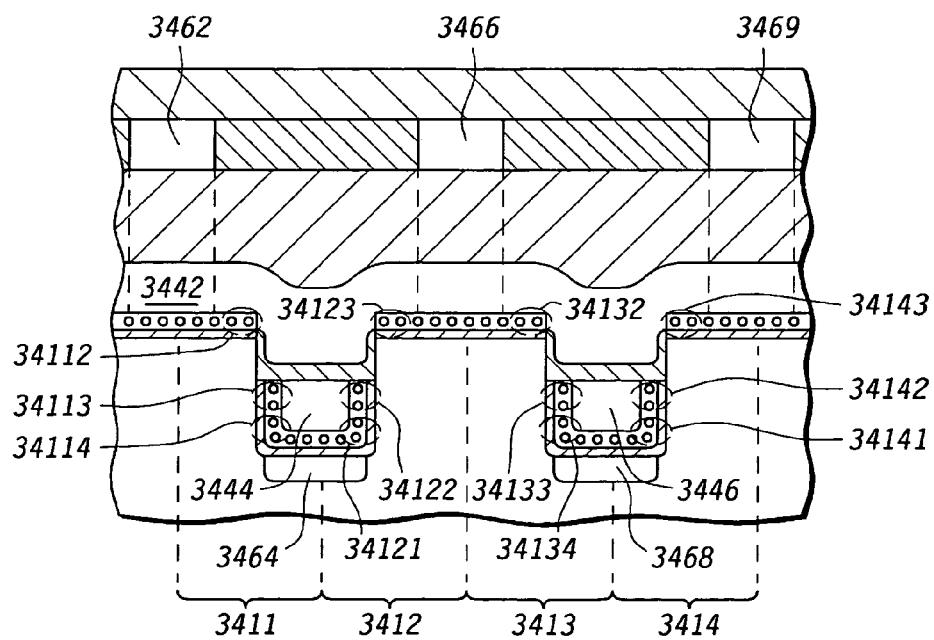

FIG. 38 includes a circuit schematic for an embodiment as described with respect to the embodiment as illustrated in FIG. 39. Memory cells 3411, 3412, 3413, 3414, 3421, 3422, 3423, and 3424 are oriented within NVM array 14, as illustrated in FIG. 38.

Referring to FIG. 38, BL1 3462 is electrically connected to a S/D region of memory cell 3411 and a S/D region of memory cell 3421. BL2 3464 is electrically connected to the other S/D regions of memory cells 3411 and 3421 and to S/D regions of memory cell 3412 and 3422. BL3 3466 is electrically connected to the other S/D regions of memory cell 3412 and 3422 and to S/D regions of memory cell 3413 and 3423. BL4 3468 is electrically connected to the other S/D regions of memory cell 3413 and 3423 and to S/D regions of memory cell 3414 and 3424. BL5 3469 is electrically connected to the other S/D regions of memory cell 3414 and 3424. GL1 3442 is electrically connected to select gate electrodes of memory cell 3411, 3412, 3413, and 3414. GL2 3444 is electrically connected to control gate electrodes of memory cell 3411, 3412, 3421 and 3422. GL3 3446 is electrically connected to control gate electrodes of memory cell 3413, 3414, 3423 and 3424. GL4 3448 is electrically connected to select gate electrodes of memory cell 3421, 3422, 3423, and 3424. Each of GL1 3442 and GL4 3448 is electrically connected to gate electrodes that each include a control gate portion and a select gate portion.

FIG. 39 illustrates a physical embodiment of a portion of NVM array 14 corresponding to the row that includes memory cells 3411, 3412, 3413, and 3414. FIG. 39 is substantially the same as an embodiment of FIG. 20 except that reference numbers as used in the circuit schematics are used in FIG. 39.

Charge storage regions for memory cells 3411 through 3414 are illustrated in FIGS. 38 and 39. Memory cell 3411 includes charge storage regions 34111 to 34114, memory cell 3412 includes charge storage region 34121 to 34124, memory cell 3413 includes charge storage region 34131 to 34134, and memory cell 3414 includes charge storage region 34141 to 34144. Note that charge storage regions 34111, 34124, 34131, and 34144 are not illustrated in FIG. 39, because those charge storage regions are offset from the plane as illustrated in the cross-sectional view of FIG. 39. Memory cells 3421 through 3424 include similar charge storage regions, but such charge storage regions are not specifically identified in FIG. 38.

FIG. 40 includes a table that has some of the operating voltages for memory cells, as illustrated in FIG. 38.

All memory cells, as illustrated in FIG. 38 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

The embodiments as described with respect to FIGS. 22 through 25 can be represented by the circuit schematic as illustrated in FIG. 38 and can be operated using the voltages as listed in FIG. 40.

Figure 41:
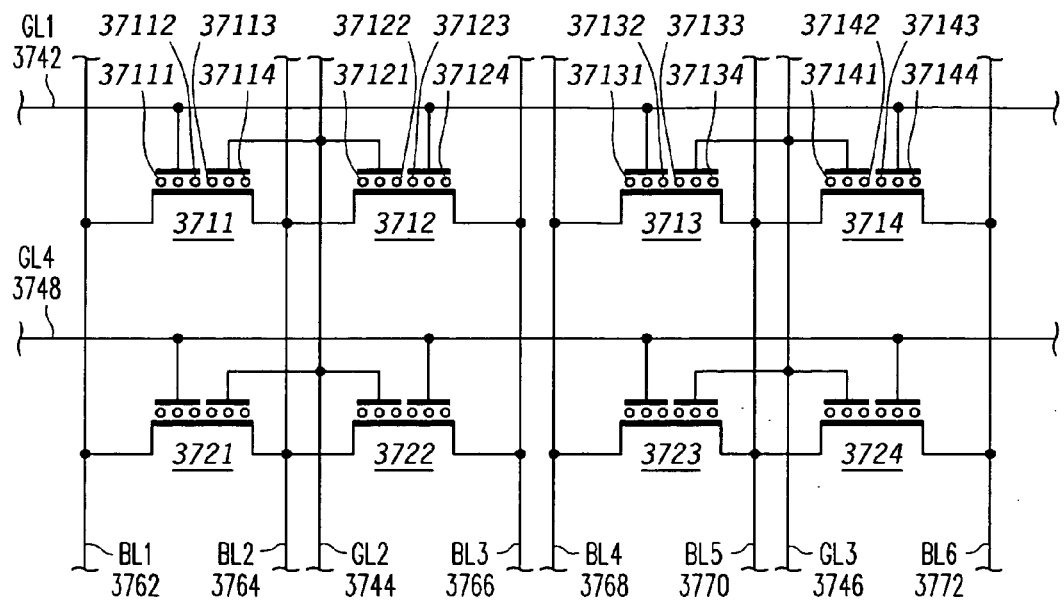
Figure 42:
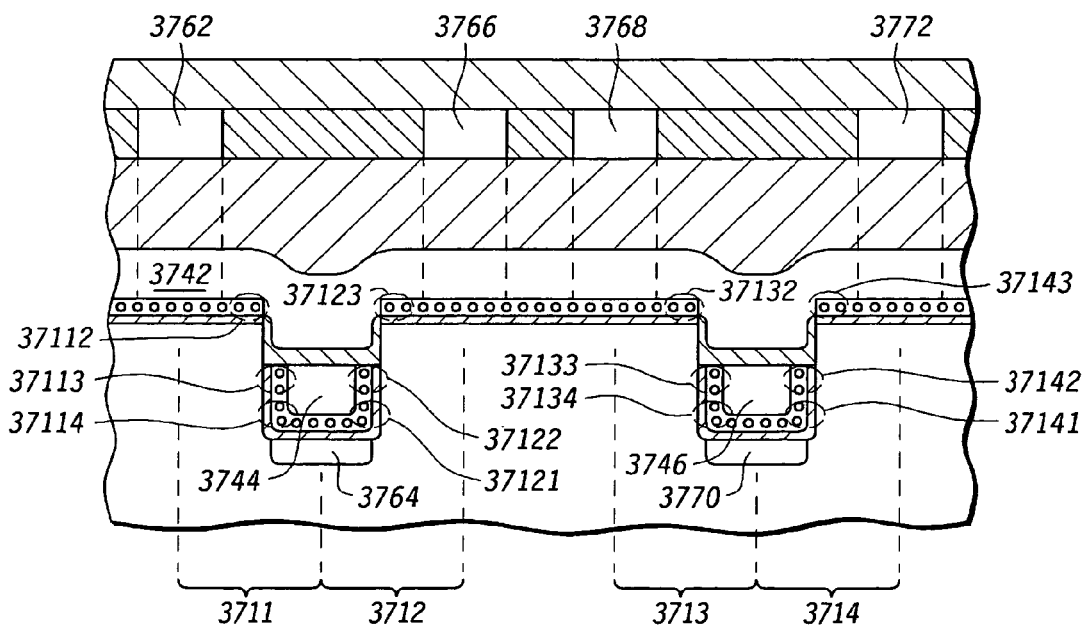

FIG. 41 includes a circuit schematic for an embodiment as described with respect to the embodiment as illustrated in FIG. 42. Memory cells 3711, 3712, 3713, 3714, 3721, 3722, 3723, and 3724 are oriented within NVM array 14, as illustrated in FIG. 41.

Referring to FIG. 41, BL1 3762 is electrically connected to a S/D region of memory cell 3711 and a S/D region of memory cell 3721. BL2 3764 is electrically connected to the other S/D regions of memory cells 3711 and 3721 and to S/D regions of memory cells 3712 and 3722. BL3 3766 is electrically connected to the other S/D regions of memory cells 3712 and 3722. BL4 3768 is electrically connected to S/D regions of memory cells 3713 and 3723. BL5 3770 is electrically connected to the other S/D regions of memory cells 3713 and 3723, and S/D regions of memory cells 3714 and 3724. BL6 3772 is electrically connected to the other S/D regions of memory cells 3714 and 3724. GL1 3742 is electrically connected to select gate electrodes of memory cell 3711, 3712, 3713, and 3714. GL2 3744 is electrically connected to control gate electrodes of memory cell 3711, 3712, 3721, and 3722. GL3 3746 is electrically connected to control gate electrodes of memory cell 3713, 3714, 3723, and 3724. GL4 3748 is electrically connected to select gate electrodes of memory cell 3721, 3722, 3723, and 3724. Each of GL1 3742 and GL4 3748 is electrically connected to gate electrodes that each include a control gate portion and a select gate portion.

FIG. 42 illustrates a physical embodiment of a portion of NVM array 14 corresponding to the row that includes memory cells 3711, 3712, 3713, and 3714. FIG. 42 is substantially the same as FIG. 28 except that reference numbers as used in the circuit schematics are used in FIG. 42.

Charge storage regions for memory cells 3711 through 3714 are illustrated in FIGS. 41 and 42. Memory cell 3711 includes charge storage regions 37111 to 37114, memory cell 3712 includes charge storage region 37121 to 37124, memory cell 3713 includes charge storage region 37131 to 37134, and memory cell 3714 includes charge storage region 37141 to 37144. Note that charge storage regions 37111, 37124, 37131, and 37144 are not illustrated in FIG. 42, because those charge storage regions are offset from the plane as illustrated in the cross-sectional view of FIG. 42. Memory cells 3721 through 3724 include similar charge storage regions, but such charge storage regions are not specifically identified in FIG. 41.

FIG. 43 includes a table that has some of the operating voltages for memory cells, as illustrated in FIG. 41.

All memory cells, as illustrated in FIG. 41 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Many details have been described with respect to NVM array 14, its memory cells, bit lines, and gate lines. After reading this specification, skilled artisans will appreciate that the row and column orientations can be reversed. Electrically connections between memory cells and their associated bit lines, gate lines, or any combination thereof along one or more rows can be changed to one or more columns. Similarly, electrically connections between memory cells and their associated bit lines, gate lines, or any combination thereof along one or more columns can be changed to one or more rows.

Embodiments as described herein are useful in forming NMV arrays or a portion thereof. The use of discontinuous storage elements within a trench in the substrate allows smaller memory cells to be formed and increase memory density. The discontinuous storage elements can also allow more bits to be stored within a memory cell as opposed to a conventional floating gate structure. In one embodiment, portions of the discontinuous storage elements lie between all of the gate electrodes and the substrate. In a particular embodiment, the portions of the discontinuous storage elements lie between all of the gate electrodes and the substrate at substantially all locations where gate electrodes overlie the substrate. The portions of discontinuous storage elements can allow up to six bits of data to be stored per memory cell. The fabrication of the NVM array can be implemented using existing materials and equipment. Therefore, process integration would not require developing new processes for new equipment or having to address materials incompatibility issues. The memory cells can be formed such that select gate lines are formed, such that they are at least partly recessed within the trenches.

Source-side injection can be used to program some of the charge storage regions of memory cells. The thickness of the intergate dielectric portions 114 and 115 and programming voltages can be selected to allow a relatively larger electrical field to be generated near the intergate dielectric portions 114 and 115 as compared to near the S/D regions that are electrically connected to the bit lines. The source-side injection allows programming times similar to conventional hot-electron injection and has a higher electron efficiency compared to conventional hot-electron injection.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate including a first trench that includes a wall and a bottom and extends from a primary surface of the substrate. The electronic device can also include a first set of discontinuous storage elements, wherein the first set of discontinuous storage elements overlies the primary surface of the substrate. The electronic device can further include a second set of the discontinuous storage elements including a first portion. The first portion of the second set of discontinuous storage elements can lie within the first trench, and the first portion of the second set of discontinuous storage elements is spaced apart from the first set of discontinuous storage elements. The electronic can still further include a first gate electrode within the first trench, wherein at least a part of the first portion of the second set of discontinuous storage elements lies between the first gate electrode and the wall of the first trench. The electronic device can also include a second gate electrode overlying the first gate electrode and the primary surface of the substrate.

In one embodiment of the first aspect, the first gate electrode has an upper surface that lies below the primary surface of the substrate. In a particular embodiment, the second gate electrode extends at least partly within the first trench. In another particular embodiment, the electronic device further includes a third gate electrode within a second trench. The substrate further includes the second trench that is spaced apart from the first trench, wherein the second trench includes a wall and a bottom and extends from the primary surface of the substrate. The second set of the discontinuous storage elements includes a second portion that lies within the second trench. The third gate electrode has an upper surface that lies below the primary surface of the substrate, wherein the second portion of the second set of discontinuous storage elements lies between the third gate electrode and the wall of the second trench.

In a more particular embodiment of the first aspect, the electronic device further includes a first doped region lying within the substrate below the first trench, and a second doped region lying within the substrate below the second trench. In an even more particular embodiment, the electronic device further includes a third doped region lying along the primary surface of the substrate between the first and second trenches. In a still more particular embodiment, the third doped region extends to the walls of the first and second trenches. In another still more particular embodiment, the third doped region is spaced apart from the walls of the first and second trenches.

In another more particular embodiment of the first aspect, a first charge storage region includes a first discontinuous storage element within the first portion of the second set of discontinuous storage elements, wherein the first discontinuous storage element lies closer to the upper surface of the first gate electrode than the first doped region. A second charge storage region includes a second discontinuous storage element within the first portion of the second set of discontinuous storage elements, wherein the second discontinuous storage element lies closer to the first doped region than the upper surface of the first gate electrode, and wherein the second charge storage region is spaced apart from the first charge storage region. A third charge storage region includes a third discontinuous storage element within the second portion of the second set of discontinuous storage elements, wherein the third discontinuous storage element lies closer to the upper surface of the third gate electrode than the second doped region. A fourth charge storage region includes a fourth discontinuous storage element within the second portion of the second set of discontinuous storage elements, wherein the fourth discontinuous storage element lies closer to the second doped region than the upper surface of the third gate electrode, and wherein the fourth charge storage region is spaced apart from the third charge storage region.

In still another more particular embodiment of the first aspect, the second gate electrode overlies the first gate electrode, the third gate electrode, and a portion of the substrate between the first and second trenches. In a further more particular embodiment, the electronic device further includes a fourth gate electrode spaced apart from the third gate electrode. The second gate electrode overlies the first gate electrode and a first portion of the substrate between the first and second trenches, and the fourth gate electrode overlies the third gate electrode and a second portion of the substrate between the first and second trenches.

In another embodiment of the first aspect, the electronic device further includes a first dielectric layer lying along the wall and bottom of the first trench, and a second dielectric layer lying between the first portion of the second set of the discontinuous storage elements and the first gate electrode. In still another embodiment, each of first and second sets of discontinuous storage elements includes silicon nanocrystals or metal nanoclusters. In yet another embodiment, from a cross-sectional view, the first gate electrode includes portions, and the portions of the first gate electrode include curved outer surfaces that face each other.

In a second aspect, an electronic device can include a substrate including a first trench and a second trench that are spaced apart from each other, wherein each of the first and second trenches includes a wall and a bottom and extends from a primary surface of the substrate. The electronic device can also include a first doped region lying within the substrate along the bottom of the first trench, and a second doped region lying within the substrate along the bottom of the second trench. The electronic device can further include a first dielectric layer lying along the walls and bottoms of the first and second trenches, and discontinuous storage elements. A first set of the discontinuous storage elements can overlie the primary surface between the first and second trenches and a second set of the discontinuous storage elements. A first portion of the second set of the discontinuous storage elements can lie within the first trench, and a second portion of the second set of the discontinuous storage elements can lie within the second trench. Each of the first and second portions of the second set of the discontinuous storage elements can be spaced apart from the primary surface of the substrate and the first set of discontinuous storage elements. The electronic device can still further include a second dielectric layer adjacent to the first and second portions of the discontinuous storage elements, and a first gate electrode lying within the first trench and having an upper surface that lies below the primary surface of the substrate, wherein at least a part of the first portion of the second set of discontinuous storage elements lies between the first gate electrode and the wall of the first trench. The electronic device can yet further include a second gate electrode lying within the second trench and having an upper surface that lies below the primary surface of the substrate, wherein at least a part of the second portion of second set of discontinuous storage elements lies between the second gate electrode and the wall of the second trench. The electronic device can also include a third dielectric layer including a first portio overlying the first gate electrode within the first trench and a second portion overlying the second gate electrode within the second trench. The electronic device can further include a third gate electrode overlying (1) at least one of the first portion or the second portion of third dielectric layer, and (2) at least one of the first portion or the second portion of the second set of the discontinuous storage elements.

In a third aspect, an electronic device can include a first set of memory cells oriented substantially along a first direction, wherein each memory cell within the first set of memory cells includes a first gate electrode that includes a control gate portion and a select gate portion. The electronic device can also include a second set of memory cells oriented substantially along the first direction, wherein each memory cell within the second set of memory cells includes a first gate electrode that includes a control gate portion and a select gate portion. The electronic device can further include a first conductive line electrically connected to the first set of memory cells, wherein the first conductive line is of a type including a gate line or a bit line, and a second conductive line electrically connected to the second set of memory cells. The second conductive line can be of a same type as the first conductive line, and when compared to the first conductive line, the second conductive line can be electrically connected to more sets of memory cells that lie along the first direction.

In one embodiment of the third aspect, each memory cell within the first and second sets of memory cells includes a nonvolatile memory cell that includes the first gate electrode and a second gate electrode. The first gate electrode includes a control gate portion and a select gate portion, the second gate electrode is a control gate electrode, and the select gate portion of the first gate electrode lies between the second gate electrode and the control gate portion of the first electrode. For each memory cell within the first and second sets of memory cells, a discontinuous storage element lies between a channel region and the control gate portion of first gate electrode, another discontinuous storage element lies between the channel region and the second gate electrode, and substantially none of the discontinuous storage elements lies between the channel region and the select gate portion of first gate electrode.

In a particular embodiment of the third aspect, the electronic device further includes a third set of memory cells oriented substantially along the first direction, wherein the first, second, and third sets of memory cells lie within different rows or different columns as compared to one another. Each memory cell within the third set of memory cells includes a nonvolatile memory cell that includes the first gate electrode and a second gate electrode. The first gate electrode includes a control gate portion and a select gate portion, the second gate electrode is a control gate electrode, and the select gate portion of the first gate electrode lies between the second gate electrode and the control gate portion of the first electrode. For each memory cell within the third set of memory cells, at least one of the discontinuous storage elements lies between a channel region and the control gate portion of first gate electrode, another of the discontinuous storage elements lies between the channel region and the second gate electrode, and substantially none of the discontinuous storage elements lies between the channel region and the select gate portion of first gate electrode. The first conductive line is a first gate line that is electrically connected to the first gate electrodes of the first set of memory cells, and the second conductive line is a second gate line that is electrically connected to the second gate electrodes of the second and third sets of memory cells.

In another embodiment of the third aspect, the electronic device further includes a third set of memory cells oriented substantially along the first direction, wherein the first, second, and third sets of memory cells lie within different rows or different columns as compared to one another. The first conductive line is a first bit line, and the second conductive line is a second bit line electrically connected to the second and third sets of memory cells. In still another embodiment, the first direction is associated with a row or a column.

In a fourth aspect, a process for forming an electronic device can include forming a first set of discontinuous storage elements over a primary surface of a substrate. The process can also include forming a first trench within the substrate, wherein the first trench includes a wall and a bottom and extends from the primary surface of the substrate and forming a second set of discontinuous storage elements, wherein a first portion of the second set of discontinuous storage elements lie within the first trench. The process can further include forming a first gate electrode within the first trench after forming the second set of discontinuous storage elements, wherein the first gate electrode has an upper surface that lies below the primary surface of the substrate, and at least a part of the first portion of the second set of discontinuous storage elements lies between the first gate electrode and the wall of the first trench. The process can still further include removing a part of the first portion of the second set of discontinuous storage elements that overlies the primary surface of the substrate. The process can yet further include forming a second gate electrode that overlies the first gate electrode and the primary surface of the substrate, wherein after forming the second gate electrode, substantially none of the first portion of the second set of discontinuous storage elements lies along the wall of the first trench at an elevation between an upper surface of the first gate electrode and the primary surface of the substrate.

In one embodiment of the fourth aspect, forming the second gate electrode includes forming the second gate electrode, such that at least a portion of the second gate electrode extends at least partly into the first trench. In another embodiment, the process further includes forming a third gate electrode within the second trench. Forming the first trench further includes forming a second trench that is spaced apart from the first trench, wherein the second trench includes a wall and a bottom and extends from a primary surface of the substrate. Forming the second set of discontinuous storage elements further includes forming a second portion of the second set of discontinuous storage elements within the second trench. Forming the third gate electrode includes forming the third gate electrode, such that the third gate electrode has an upper surface that lies below the primary surface of the substrate, and at least a part of the second portion of the second set of discontinuous storage elements lies between the third gate electrode and the wall of the second trench. After forming the second gate electrode, substantially none of the second portion of the second set of discontinuous storage elements lies along the wall of the second trench at an elevation between an upper surface of the third gate electrode and the primary surface of the substrate.

In a particular embodiment of the fourth aspect, the process further includes forming a first doped region and a second doped region along the bottoms of the first and second trenches, respectively. In a more particular embodiment, the process further includes forming a third doped region lying along the primary surface of the substrate between the first and second trenches. In a still more particular embodiment, forming the third doped region is performed before forming the second gate electrode. In another still more particular embodiment, forming the third doped region is performed after forming the second gate electrode.

In another more particular embodiment of the fourth aspect, after forming the second gate electrode, a first charge storage region includes the first discontinuous storage element, wherein the first discontinuous storage element lies closer to the upper surface of the first gate electrode than the first doped region. A second charge storage region includes a second discontinuous storage element within the first portion of the discontinuous storage elements, wherein the second discontinuous storage element lies closer to the first doped region than the upper surface of the first gate electrode, and wherein the second charge storage region is spaced apart from the first charge storage region. A third charge storage region includes a third discontinuous storage element, wherein the third discontinuous storage element lies closer to the upper surface of the third gate electrode than the second doped region. A fourth charge storage region includes a fourth discontinuous storage element within the second portion of the discontinuous storage elements, wherein the fourth discontinuous storage element lies closer to the second doped region than the upper surface of the third gate electrode, and wherein the fourth charge storage region is spaced apart from the third charge storage region.

In another particular embodiment of the fourth aspect, forming the second gate electrode includes forming the second gate electrode such that the second gate electrode overlies the first and third gate electrodes, and from a top view, lengths of the first and second trenches are substantially perpendicular to a length of the second gate electrode. In still another particular embodiment, the process further includes forming a fourth gate electrode. Forming the second gate electrode includes forming the second gate electrode, such that the second gate electrode that overlies the first gate electrode, and forming the fourth gate electrode includes forming the fourth gate electrode, such that the fourth gate electrode that overlies the third gate electrode. From a top view, a length of the first trench is substantially parallel to a length of the second gate electrode, and a length of the second trench is substantially parallel to a length of the fourth gate electrode.

In another embodiment of the fourth aspect, the process further includes forming a first dielectric layer lying along the wall and bottom of the first trench, forming a second dielectric layer after forming the second set of discontinuous storage elements, and forming a third dielectric layer after forming the first gate electrode. In a particular embodiment, forming the third dielectric layer and removing the part of the first portion of the second set of discontinuous storage elements include oxidizing an exposed portion of the first gate electrode, and a part of the first portion of the second set of discontinuous storage elements that do not lie between the first gate electrode and the wall of the first trench.

In still another embodiment of the fourth aspect, forming the first gate electrode includes forming a conductive layer after forming the second set of discontinuous storage elements, polishing the conductive layer to a remove portion of the conductive layer that overlies the primary surface of the substrate, and recessing the conductive layer within the first trench to form the first gate electrode, such that the upper surface of the first gate electrode lies below the primary surface. In yet another embodiment, forming the first gate electrode includes forming a conductive layer after forming the second set of discontinuous storage elements, and anisotropically etching the conductive layer to form the first gate electrode, which from a cross-sectional view, has a sidewall spacer shape.

In a further embodiment of the fourth aspect, forming the first set of discontinuous storage elements or forming the first set of discontinuous storage elements includes forming silicon nanocrystals or forming metal nanoclusters. In still a further embodiment, the process further includes removing a part of the first set of discontinuous storage elements that overlie a region of the substrate where the first trench is to be formed.

In a fifth aspect, a process for forming an electronic device can include forming a first set of discontinuous storage elements over a primary surface of a substrate and removing parts of the first set of discontinuous storage elements that overlie regions of the substrate where a first trench and a second trench are to be formed. The process also can include forming the first and second trenches within the substrate, wherein the first trench is spaced apart from the second trench, and each of the first and second trenches includes a wall and a bottom and extends from a primary surface of the substrate. The process can further include forming a second set of discontinuous storage elements, wherein a first portion of the second set of discontinuous storage elements lie within the first trench, and a second portion of the second set of discontinuous storage elements lie within the second trench. The process can still further include forming a first conductive layer after forming the first and second sets of discontinuous storage elements, and removing a portion of the first conductive layer that overlies the primary surface of the substrate to form a first gate electrode within the first trench and a second gate electrode within the second trench. The first gate electrode has an upper surface that lies below the primary surface of the substrate, a first discontinuous storage element within the first portion of the discontinuous storage elements lies between the first gate electrode and the wall of the first trench, the second gate electrode has an upper surface that lies below the primary surface of the substrate, and a second discontinuous storage element within the second portion of the discontinuous storage elements lies between the second gate electrode and the wall of the first trench. The process can yet further include removing parts of the second set of discontinuous storage elements that overlie the primary surface of the substrate, lie along the wall of the first trench at an elevation between the upper surface of the first gate electrode and the primary surface of the substrate, and lie along the wall of the second trench at an elevation between the upper surface of the second gate electrode and the primary surface of the substrate. The process can also include forming a first dielectric layer over the first gate electrode, wherein the first dielectric layer has an upper surface within the first trench and a second portion with an upper surface within the second trench, and forming a second dielectric layer over the second gate electrode, wherein the second dielectric layer has a first portion with an upper surface within the second trench. The process can further include forming a second conductive layer after forming the first and second dielectric layers, and patterning the second conductive layer to form a third gate electrode that overlies the first gate electrode and the primary surface of the substrate. After patterning the second conductive layer substantially none of the first portion of the second set of discontinuous storage elements lies along the wall of the first trench at an elevation between an upper surface of the first gate electrode and the primary surface of the substrate, and substantially none of the second portion of the second set of discontinuous storage elements lies along the wall of the second trench at an elevation between an upper surface of the second gate electrode and the primary surface of the substrate.

In one embodiment of the fifth aspect, the process further includes forming a first doped region and a second doped region along the bottoms of the first and second trenches, respectively, and forming a third doped region along the primary surface of the substrate between the first and second trenches.

In another embodiment of the fifth aspect, after forming the second gate electrode, a first charge storage region includes the first discontinuous storage element, wherein the first discontinuous storage element lies closer to the upper surface of the first gate electrode than the first doped region. A second charge storage region includes a third discontinuous storage element within the first portion of the discontinuous storage elements, wherein the third discontinuous storage element lies closer to the first doped region than the upper surface of the first gate electrode, and wherein the second charge storage region is spaced apart from the first charge storage region. A third charge storage region includes the second discontinuous storage element, wherein the second discontinuous storage element lies closer to the upper surface of the third gate electrode than the second doped region. A fourth charge storage region includes a fourth discontinuous storage element within the second portion of the discontinuous storage elements, wherein the fourth discontinuous storage element lies closer to the second doped region than the upper surface of the third gate electrode, and wherein the fourth charge storage region is spaced apart from the third charge storage region.

In still another embodiment of the fifth aspect, forming the first set of discontinuous storage elements or forming the first set of discontinuous storage elements includes forming silicon nanocrystals or forming metal nanoclusters.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device, the process comprising:

forming a first set of discontinuous storage elements over a primary surface of a substrate;

forming a first trench within the substrate, wherein the first trench includes a wall and a bottom and extends from the primary surface of the substrate;

forming a second set of discontinuous storage elements, wherein a first portion of the second set of discontinuous storage elements lie within the first trench;

forming a first gate electrode within the first trench after forming the second set of discontinuous storage elements, wherein:

the first gate electrode has an upper surface that lies below the primary surface of the substrate; and at least a part of the first portion of the second set of discontinuous storage elements lies between the first gate electrode and the wall of the first trench;

removing a part of the first portion of the second set of discontinuous storage elements that overlies the primary surface of the substrate;

forming a second gate electrode that overlies the first gate electrode and the primary surface of the substrate, wherein after forming the second gate electrode, substantially none of the first portion of the second set of discontinuous storage elements lies along the wall of the first trench at an elevation between an upper surface of the first gate electrode and the primary surface of the substrate.

2. The process of claim 1, wherein forming the second gate electrode comprises forming the second gate electrode, such that at least a portion of the second gate electrode extends at least partly into the first trench.

3. The process of claim 1, further comprising forming a third gate electrode within the second trench wherein:

forming the first trench further comprises forming a second trench that is spaced apart from the first trench, wherein the second trench includes a wall and a bottom and extends from a primary surface of the substrate;

forming the second set of discontinuous storage elements further includes forming a second portion of the second set of discontinuous storage elements within the second trench;

forming the third gate electrode comprises forming the third gate electrode, such that:

the third gate electrode has an upper surface that lies below the primary surface of the substrate; and at least a part of the second portion of the second set of discontinuous storage elements lies between the third gate electrode and the wall of the second trench; and after forming the second gate electrode, substantially none of the second portion of the second set of discontinuous storage elements lies along the wall of the second trench at an elevation between an upper surface of the third gate electrode and the primary surface of the substrate.

4. The process of claim 3, wherein forming the second gate electrode comprises forming the second gate electrode such that:

the second gate electrode overlies the first and third gate electrodes; and from a top view, lengths of the first and second trenches are substantially perpendicular to a length of the second gate electrode.

5. The process of claim 3, further comprising forming a fourth gate electrode, wherein:

forming the second gate electrode comprises forming the second gate electrode, such that the second gate electrode that overlies the first gate electrode;

forming the fourth gate electrode comprises forming the fourth gate electrode, such that the fourth gate electrode that overlies the third gate electrode; and from a top view:

a length of the first trench is substantially parallel to a length of the second gate electrode; and a length of the second trench is substantially parallel to a length of the fourth gate electrode.

6. The process of claim 3, further comprising forming a first doped region and a second doped region along the bottoms of the first and second trenches, respectively.

7. The process of claim 6, wherein after forming the second gate electrode:

a first charge storage region includes the first discontinuous storage element, wherein the first discontinuous storage element lies closer to the upper surface of the first gate electrode than the first doped region;

a second charge storage region includes a second discontinuous storage element within the first portion of the discontinuous storage elements, wherein the second discontinuous storage element lies closer to the first doped region than the upper surface of the first gate electrode, and wherein the second charge storage region is spaced apart from the first charge storage region;

a third charge storage region includes a third discontinuous storage element, wherein the third discontinuous storage element lies closer to the upper surface of the third gate electrode than the second doped region; and a fourth charge storage region includes a fourth discontinuous storage element within the second portion of the discontinuous storage elements, wherein the fourth discontinuous storage element lies closer to the second doped region than the upper surface of the third gate electrode, and wherein the fourth charge storage region is spaced apart from the third charge storage region.

8. The process of claim 6, further comprising forming a third doped region lying along the primary surface of the substrate between the first and second trenches.

9. The process of claim 8, wherein forming the third doped region is performed before forming the second gate electrode.

10. The process of claim 8, wherein forming the third doped region is performed after forming the second gate electrode.

11. The process of claim 1, further comprising:

forming a first dielectric layer lying along the wall and bottom of the first trench;

forming a second dielectric layer after forming the second set of discontinuous storage elements; and forming a third dielectric layer after forming the first gate electrode.

12. The process of claim 11, wherein forming the third dielectric layer and removing the part of the first portion of the second set of discontinuous storage elements comprise oxidizing:
   an exposed portion of the first gate electrode; and
   a part of the first portion of the second set of discontinuous storage elements that do not lie between the first gate electrode and the wall of the first trench.

13. The process of claim 1, wherein forming the first gate electrode comprises:
   forming a conductive layer after forming the second set of discontinuous storage elements;
   polishing the conductive layer to a remove portion of the conductive layer that overlies the primary surface of the substrate; and
   recessing the conductive layer within the first trench to form the first gate electrode, such that the upper surface of the first gate electrode lies below the primary surface.

14. The process of claim 1, wherein forming the first gate electrode comprises:
   forming a conductive layer after forming the second set of discontinuous storage elements; and
   anisotropically etching the conductive layer to form the first gate electrode, which from a cross-sectional view, has a sidewall spacer shape.

15. The process of claim 1, wherein forming the first set of discontinuous storage elements or forming the first set of discontinuous storage elements comprises forming silicon nanocrystals or forming metal nanoclusters.

16. The process of claim 1, further comprising removing a part of the first set of discontinuous storage elements that overlie a region of the substrate where the first trench is to be formed.

17. A process for forming an electronic device, the process comprising:
   forming a first set of discontinuous storage elements over a primary surface of a substrate;
   removing parts of the first set of discontinuous storage elements that overlie regions of the substrate where a first trench and a second trench are to be formed;
   forming the first and second trenches within the substrate, wherein:
      the first trench is spaced apart from the second trench; and
      each of the first and second trenches includes a wall and a bottom and extends from a primary surface of the substrate;
   forming a second set of discontinuous storage elements, wherein:
      a first portion of the second set of discontinuous storage elements lie within the first trench; and
      a second portion of the second set of discontinuous storage elements lie within the second trench; and
   forming a first conductive layer after forming the first and second sets of discontinuous storage elements;
   removing a portion of the first conductive layer that overlies the primary surface of the substrate to form a first gate electrode within the first trench and a second gate electrode within the second trench, wherein:
      the first gate electrode has an upper surface that lies below the primary surface of the substrate;
      a first discontinuous storage element within the first portion of the discontinuous storage elements lies between the first gate electrode and the wall of the first trench;
      the second gate electrode has an upper surface that lies below the primary surface of the substrate; and
      a second discontinuous storage element within the second portion of the discontinuous storage elements lies between the second gate electrode and the wall of the first trench;
   removing parts of the second set of discontinuous storage elements that:
      overlie the primary surface of the substrate;
      lie along the wall of the first trench at an elevation between the upper surface of the first gate electrode and the primary surface of the substrate; and
      lie along the wall of the second trench at an elevation between the upper surface of the second gate electrode and the primary surface of the substrate;
   forming a first dielectric layer over the first gate electrode, wherein the first dielectric layer has an upper surface within the first trench and a second portion with an upper surface within the second trench;
   forming a second dielectric layer over the second gate electrode, wherein the second dielectric layer has a first portion with an upper surface within the second trench;
   forming a second conductive layer after forming the first and second dielectric layers; and
   patterning the second conductive layer to form a third gate electrode that overlies the first gate electrode and the primary surface of the substrate, wherein after patterning the second conductive layer:
      substantially none of the first portion of the second set of discontinuous storage elements lies along the wall of the first trench at an elevation between an upper surface of the first gate electrode and the primary surface of the substrate; and
      substantially none of the second portion of the second set of discontinuous storage elements lies along the wall of the second trench at an elevation between an upper surface of the second gate electrode and the primary surface of the substrate.

18. The process of claim 17, further comprising:
   forming a first doped region and a second doped region along the bottoms of the first and second trenches, respectively; and
   forming a third doped region along the primary surface of the substrate between the first and second trenches.

19. The process of claim 17, wherein after forming the second gate electrode:
   a first charge storage region includes the first discontinuous storage element, wherein the first discontinuous storage element lies closer to the upper surface of the first gate electrode than the first doped region;
   a second charge storage region includes a third discontinuous storage element within the first portion of the discontinuous storage elements, wherein the third discontinuous storage element lies closer to the first doped region than the upper surface of the first gate electrode, and wherein the second charge storage region is spaced apart from the first charge storage region;
   a third charge storage region includes the second discontinuous storage element, wherein the second discontinuous storage element lies closer to the upper surface of the third gate electrode than the second doped region; and a fourth charge storage region includes a fourth discontinuous storage element within the second portion of the discontinuous storage elements, wherein the fourth discontinuous storage element lies closer to the second doped region than the upper surface of the third gate electrode, and wherein the fourth charge storage region is spaced apart from the third charge storage region.

20. The process of claim 17, wherein forming the first set of discontinuous storage elements or forming the first set of discontinuous storage elements comprises forming silicon nanocrystals or forming metal nanoclusters.

* * * * *